(12) United States Patent
Gilbert et al.

(10) Patent No.: US 7,917,314 B2
(45) Date of Patent: Mar. 29, 2011

(54) INTELLIGENT ELECTRONIC DEVICE HAVING NETWORK ACCESS

(75) Inventors: Bryan J. Gilbert, Victoria (CA); J. Bradford Forth, Victoria (CA); Jordon M. Dagg, Victoria (CA); Martin A. Hancock, Victoria (CA); Markus F. Hirschbold, Victoria (CA); Geoffrey T. Hyatt, Victoria (CA); Simon H. Lightbody, Victoria (CA)

(73) Assignee: Power Measurement Ltd., Saanichton, B.C. (CA)

( * ) Notice: Subject to any disclaimer, the term of this patent is extended or adjusted under 35 U.S.C. 154(b) by 342 days.

(21) Appl. No.: 12/047,774

(22) Filed: Mar. 13, 2008

(65) Prior Publication Data
US 2008/0154523 A1    Jun. 26, 2008

Related U.S. Application Data

(63) Continuation of application No. 10/712,960, filed on Nov. 13, 2003, now Pat. No. 7,415,368, which is a continuation of application No. 09/792,701, filed on Feb. 23, 2001, now Pat. No. 7,085,824.

(51) Int. Cl.
*G06F 19/00* (2006.01)

(52) U.S. Cl. ........................................................ 702/61

(58) Field of Classification Search .............. 702/61–64, 702/182, 188; 324/74, 141, 142; 340/870.01, 340/870.03
See application file for complete search history.

(56) References Cited

U.S. PATENT DOCUMENTS

| | | | |
|---|---|---|---|
| 4,225,839 | A | 9/1980 | Martincic |
| 4,377,837 | A | 3/1983 | Matsko et al. |
| 4,589,075 | A | 5/1986 | Buennagel |
| 4,900,275 | A | 2/1990 | Fasano |
| 4,957,876 | A | 9/1990 | Shibata et al. |
| 5,001,420 | A | 3/1991 | Germer et al. |
| 5,056,214 | A | 10/1991 | Holt |
| 5,192,227 | A | 3/1993 | Bales |
| 5,248,967 | A | 9/1993 | Daneshfar |
| 5,301,122 | A | 4/1994 | Halpern |
| 5,418,752 | A | 5/1995 | Harari et al. |
| 5,418,837 | A | 5/1995 | Johansson et al. |
| 5,544,312 | A | 8/1996 | Hasbun et al. |

(Continued)

FOREIGN PATENT DOCUMENTS

CA        2299002        2/2000

(Continued)

OTHER PUBLICATIONS

Quick Facts Sheet, "*6200 ION Compact Modular Power & Energy Meter*", Power Measurement, Dec. 2000, 2 pgs.

(Continued)

*Primary Examiner* — Edward Raymond
(74) *Attorney, Agent, or Firm* — Brinks Hofer Gilson & Lione

(57) ABSTRACT

An electric power meter is disclosed. The meter comprises means for digitally sampling voltage and current. The meter further comprises means for storing the digitally sampled voltage and current. The meter further comprises means for performing power calculations upon the digitally sampled voltage and current, and converting the calculations and the digitally sampled voltage and current into at least one network protocol. The meter further comprises means for interfacing with an external network. A system for modifying the functionality of the electric power meter is also disclosed.

29 Claims, 21 Drawing Sheets

U.S. PATENT DOCUMENTS

| | | |
|---|---|---|
| 5,548,527 A | 8/1996 | Hemminger et al. |
| 5,555,508 A | 9/1996 | Munday et al. |
| 5,570,292 A | 10/1996 | Abraham et al. |
| 5,602,363 A | 2/1997 | Von Arx |
| 5,627,759 A | 5/1997 | Bearden et al. |
| 5,650,936 A | 7/1997 | Loucks et al. |
| 5,654,081 A | 8/1997 | Todd |
| 5,675,748 A | 10/1997 | Ross |
| 5,680,640 A | 10/1997 | Ofek et al. |
| 5,704,805 A | 1/1998 | Douty et al. |
| 5,710,887 A | 1/1998 | Chelliah et al. |
| 5,715,314 A | 2/1998 | Payne et al. |
| 5,736,847 A | 4/1998 | Van Doorn et al. |
| 5,767,790 A | 6/1998 | Jovellana |
| 5,768,148 A | 6/1998 | Murphy et al. |
| 5,811,965 A | 9/1998 | Gu |
| 5,828,576 A | 10/1998 | Loucks et al. |
| 5,862,391 A | 1/1999 | Salas |
| 5,880,927 A | 3/1999 | Kent et al. |
| 5,896,393 A | 4/1999 | Yard et al. |
| 5,897,607 A | 4/1999 | Jenney et al. |
| 5,907,476 A | 5/1999 | Davidsz |
| 5,909,492 A | 6/1999 | Payne et al. |
| 5,933,004 A | 8/1999 | Jackson et al. |
| 5,936,971 A | 8/1999 | Harari et al. |
| 5,960,204 A | 9/1999 | Yinger et al. |
| 5,963,734 A | 10/1999 | Ackerman et al. |
| 5,963,743 A | 10/1999 | Amberg et al. |
| 5,978,590 A | 11/1999 | Imai et al. |
| 5,991,543 A | 11/1999 | Amberg et al. |
| 5,994,892 A | 11/1999 | Turino et al. |
| 5,995,911 A | 11/1999 | Hart |
| 6,000,034 A | 12/1999 | Lightbody et al. |
| 6,008,711 A | 12/1999 | Bolam |
| 6,009,406 A | 12/1999 | Nick |
| 6,023,160 A | 2/2000 | Coburn |
| 6,049,551 A | 4/2000 | Hinderks et al. |
| 6,059,129 A | 5/2000 | Bechaz et al. |
| 6,064,192 A | 5/2000 | Redmyer |
| 6,078,870 A | 6/2000 | Windsheimer |
| 6,088,659 A | 7/2000 | Kelly et al. |
| 6,091,237 A | 7/2000 | Chen |
| 6,092,189 A | 7/2000 | Fisher et al. |
| 6,105,093 A | 8/2000 | Rosner et al. |
| 6,144,960 A | 11/2000 | Okada et al. |
| 6,167,383 A | 12/2000 | Henson |
| 6,178,362 B1 | 1/2001 | Woolard et al. |
| 6,182,170 B1 | 1/2001 | Lee et al. |
| 6,182,275 B1 | 1/2001 | Beelitz et al. |
| 6,185,508 B1 | 2/2001 | Van Doorn et al. |
| 6,192,470 B1 | 2/2001 | Kelley et al. |
| 6,199,068 B1 | 3/2001 | Carpenter |
| 6,212,278 B1 | 4/2001 | Bacon et al. |
| 6,219,656 B1 | 4/2001 | Cain et al. |
| 6,246,994 B1 | 6/2001 | Wolven et al. |
| 6,247,128 B1 | 6/2001 | Fisher et al. |
| 6,262,672 B1 | 7/2001 | Brooksby et al. |
| 6,272,552 B1 | 8/2001 | Melvin et al. |
| 6,275,168 B1 | 8/2001 | Slater et al. |
| 6,298,376 B1 | 10/2001 | Rosner et al. |
| 6,301,527 B1 | 10/2001 | Butland et al. |
| 6,321,272 B1 | 11/2001 | Swales |
| 6,327,706 B1 | 12/2001 | Amberg et al. |
| 6,363,057 B1 | 3/2002 | Ardalan et al. |
| 6,367,023 B2 | 4/2002 | Kling et al. |
| 6,374,084 B1 | 4/2002 | Pok |
| 6,396,839 B1 | 5/2002 | Ardalan et al. |
| 6,397,155 B1 | 5/2002 | Przydatek et al. |
| 6,401,054 B1 | 6/2002 | Andersen |
| 6,459,175 B1 | 10/2002 | Potega |
| 6,459,997 B1 | 10/2002 | Andersen |
| 6,486,652 B1 | 11/2002 | Ouellette et al. |
| 6,493,644 B1 | 12/2002 | Jonker et al. |
| 6,496,342 B1 | 12/2002 | Horvath et al. |
| 6,535,983 B1 | 3/2003 | McCormack et al. |
| 6,553,418 B1 | 4/2003 | Collins et al. |
| 6,560,221 B1 | 5/2003 | Hara et al. |
| 6,587,884 B1 | 7/2003 | Papadopoulos et al. |
| 6,618,709 B1 | 9/2003 | Sneeringer |
| 6,640,308 B1 | 10/2003 | Keyghobad et al. |
| 6,671,635 B1 | 12/2003 | Forth et al. |
| 6,687,698 B1 | 2/2004 | Nixon et al. |
| 6,694,270 B2 | 2/2004 | Hart |
| 6,714,977 B1 | 3/2004 | Fowler et al. |
| 6,751,563 B2 * | 6/2004 | Spanier et al. ............... 702/61 |
| 6,762,675 B1 | 7/2004 | Cafiero et al. |
| 6,792,337 B2 | 9/2004 | Blackett et al. |
| 6,801,920 B1 | 10/2004 | Wischinski |
| 6,961,641 B1 | 11/2005 | Forth et al. |
| 7,085,824 B2 | 8/2006 | Forth et al. |
| 7,181,517 B1 | 2/2007 | Iavergne et al. |
| 7,327,558 B2 | 2/2008 | Kennedy et al. |
| 7,447,762 B2 | 11/2008 | Curray et al. |
| 2001/0001866 A1 | 5/2001 | Kikinis |
| 2002/0007318 A1 | 1/2002 | Alnwick |
| 2002/0026385 A1 | 2/2002 | mcCloskey et al. |
| 2002/0046246 A1 | 4/2002 | Wright et al. |
| 2002/0065741 A1 | 5/2002 | Baum |
| 2002/0091784 A1 | 7/2002 | Baker et al. |
| 2002/0104022 A1 | 8/2002 | Jorgenson |
| 2002/0152200 A1 | 10/2002 | Krichilsky et al. |
| 2002/0156694 A1 | 10/2002 | Christensen et al. |
| 2002/0169570 A1 | 11/2002 | Spanier et al. |
| 2003/0009401 A1 | 1/2003 | Ellis |
| 2003/0061335 A1 | 3/2003 | Thomas et al. |
| 2003/0204756 A1 | 10/2003 | Ransom |
| 2003/0226050 A1 | 12/2003 | Yik et al. |
| 2004/0024717 A1 | 2/2004 | Sneeringer |

FOREIGN PATENT DOCUMENTS

| | | |
|---|---|---|
| WO | WO 99/13418 | 3/1999 |
| WO | WO 00/79452 A2 | 12/2000 |
| WO | WO 01/01079 A1 | 1/2001 |
| WO | WO 01/01154 A1 | 1/2001 |
| WO | WO 01/01155 A1 | 1/2001 |
| WO | WO 01/01156 A1 | 1/2001 |
| WO | WO 01/01157 A1 | 1/2001 |
| WO | WO 01/01159 A1 | 1/2001 |
| WO | WO 01/01160 A1 | 1/2001 |
| WO | WO 01/55733 A1 | 8/2001 |
| WO | WO 01/73651 | 10/2001 |

OTHER PUBLICATIONS

Brochure, "*The First True Breakthrough in Solid-State Residential Metering*", CENTRON®, 1998, 4 pages.

Manual, "*3300 ACM, Economical Digital Power Meter/Transducer—Installation and Operation Manual, Power Measurement, Ltd.*", 1999, 79 pages.

Brochure, SENTINEL™ Electronic "*Multimeasurement Meter,*" Schlumberger, Mar. 2001, 4 pages.

System Manager Software Setup Guide, Version 3.1, p. 37, 1999.

POWERLOGIC System Manager™ 3000 Software Family, Square D Schneider Electric, Bulletin No. 3080HO9601T10/98, 6 pgs., Oct. 1999.

7700 Ion 3-Phase Power Meter, Analyzer and Controller, pp. 1-8, Nov. 30, 2000.

7700 ION® User's Guide, Version 2.0, Appendix pp. A1-A8, Filed as early as Sep. 21, 1998.

7700 ION® Revenue Meter Programming Key, pp. 1-4, Aug. 6, 1997.

6200 ION, Installation & Basic Setup Instructions, © Power Measurement Ltd., Revision Date Apr. 25, 2001, 50 pages.

DSP56F801/803/805/807 16-Bit Digital Signal Processor User's Manual Preliminary—Rev. 3.0, © Motorola, Inc, 2001, 782 pages.

1991, Robert Bosch, "*CAN Specification Version 2.0*", 68 pages.

A. Lakshmikanth and Medhar M. Morcos, Article "*A Power Quality Monitoring System: A Case Study in DSP-Based Solutions for Power Electronics,*" EEE Transactions on Instrumentation and Measurement vol. 50. No. 3 Jun. 2001, 8 pages.

Niall Murphy article, Internet Appliance Design "*Forget Me Not*", Embedded Systems Programming Jun. 2001, 4 pages.

ION® Technology, Meter Shop User's Guide, © Power Measurement Ltd., Revision Date May 10, 2001, 48 pages.

Electro Industries/Gauge Tech DM Series—specification brochure, "*DMMS 425 Low-Cost Multifunction Power Monitoring Outperforms All Others in its Class*", 4 pages.

Motorola™ Preliminary Information Application Brief "*Electronic Energy Meter with Powerline Modem on DSP56F80x*", DigitalDNA from Motorola, © 2000 Motorola, Inc., 2 pages.

PM130 Serials TrueMeter™—The Low Cost Analog Replacement, specifications, Satec, Inc., 2 pages.

New MeterM@il™ and WebMeter™ features connect power meters over the Internet, annoucement by Power Measurement, Ltd., www.pwrm.com/company/news/a51, Dec. 6, 2000, p. 1, printed Jan. 30, 2004.

Power Measurement Enhances Web Communications and Security Functions on IOI Energy and Power Quality Meters, announcement by Power Measurement, Ltd., www.pwrm.com/company/news/a62, May 23, 2001, p. 1, printed Jan. 30, 2004.

User's Installation & Operation and User's Programming Manual, The Futura Series, Electro Industries, pp. 1-64, © 1995.

ION Techology, ION® MeterM@ail, setup pamphlet for network administrators, pp. 1-13, revision date Nov. 11, 2001.

Performance Power Meter & Data Acquisition Node, Electro Industries/Gauge Tech, Nexus 1250 specification, 8 pages, date unknown but before Nov. 13, 2003.

Nexus 1250 Installation and Operation Manual Revision 1.20, Electro Industries/Gauge Tech, 50 pages, Nov. 8, 2000.

ION 7700™ Xpress Card, Installation & Basic Setup Guide, Power Measurement, pp. 1-15, revision date Sep. 26, 1997.

8400 ION/8500 ION Instructional Leaflet, Power Measurement, pp. 1-8, Oct. 1999.

Nexus 1250 Precision Power Meter & Data Acquisition Node, Accumeasure® Technology, Electro Industries/GaugeTech, specification, 8 pages, date unknown but before Nov. 13, 2003.

Futura+ Series, "Advanced Power Monitoring and Analysis for the 21$^{st}$ Century", Electro Industries/GaugeTech, specification, 8 pages, date unknown but before Nov. 13, 2003.

Nexus 1250, Precision Power Meter & Data Acquisition Node, Accumeasure® Technology, Electro Industries/GaugeTech, specification, 16 pages, Nov. 1999.

3720 ACM, 3-hase Power Instrumentation Package, Power Measurement, specification, 8 pages, revision date Dec. 16, 1998.

3720 ACM, Installation & Operation Manual, Power Measurement, 67 pages, revision date Apr. 4, 2000.

Multi-port Communications Card (MPCC), Multip-Port Ethernet Communications Card (MPE), Installation & Configuration Instructions, Power Measurement, pp. 1-9, revision date Jul. 25, 1997.

ION Technology, 7500 ION Installation & Basic Setup Instructions, Power Measurement, pp. 1-37, revision date Feb. 17, 2000.

What's New in the 7500 ION, Addendum to the User's Guide Addendum v206, Power Measurement, pp. 1-33, Dec. 20, 2000.

ION Technology, 7500 ION High Visibility 3-Phase Energy & Power Quality Meter, Power Measurement, specification, pp. 1-8, revision date Mar. 21, 2000.

ION Technology 7700 ION® 3-Phase Power Meter, Analyzer and Controller, Power Measurement, specification, pp. 1-10, revision date Dec. 8, 1998.

ION Technology 7700 ION™ Installation & Operation Manual, Power Measurement, revision date Nov. 20, 1996.

ION 8000 Series Meter, Meter Connectivity, specification, Power Measurement, pp. 1-56, revision date May 1, 2001.

8500 ION Technical Documentation, 8500 ION and 8500 ION-PQ Advanced Intelligent Billing Meters, specification, Power Measurement, revision date Apr. 15, 1999.

ION® Technology 8500 ION® 8400 ION® Advanced Socket-Mount Meter, specification, Power Measurement, pp. 1-12, revision date Dec. 3, 1999.

ION® Technology 7500 ION 7600 ION High Visibility Energy and Power Quality Compliance Meters, specification, Power Measurement, pp. 1-8, revision date Nov. 30, 2000.

ION® Technology 7500 ION User's Guide, Power Measurement, 117 pgs., revision date Oct. 15, 1999.

Ramboz, J.D. and Petersons, O., NIST Measurement Services: A Calibration Service for Current Transformers, U.S. Dept. of Commerce, National Institute of Standards and Technology, U.S. Government Printing Office, Washington, Jun. 1991.

Klingensmith, W., "*Coordination and System Reliability: Choosing the Right Software*," http://222.cooperpower.com/products/systems/pdf/sys_rely.asp, Copyright 2001 Cooper Industries, Inc.

Signature System Basics, "*Here's how Signature System Works..*" http://www.signaturesystem.com/slgbasics.html, Copyright 1997, 1998, 1999, 2000 Dranetz-BMI Signature System Infonodes, "Communication Options," http://www.signaturesystem.com/infonode.html, Copyright 1997, 1998, 1999, 2000 Dranetz-BMI.

enerVista.com, Utility Enterprise Management, http://www.serv02.enervista.com/enervista.pdf, from brochure printed in Canada enerVista.com 1t.qrk, Jan. 30, 2001, 8 pgs.

"*GE Power Management enerVista.com opens window to a whole new world of web-enabled SCADA and substation management services*," http://www.serv02.enervista.com/nav/new/enerVista.pdf, Markham, ON, Sep. 6, 2000.

Engage Networks, Inc., "*Internet Protocol Card for Revenue Meters*," http://www.engagenet.com.

"*WebGate Iris (Internet Residential Information System)*" http://www.munet.com/MunetProducts_IrisIndex.html "Products," pp. 1-3 http://www.munet.com/MunetProductsIris.html "Preliminary Specification"pp. 1-2 http://www.munet.com/MunetProductsIris_Spec.html.

"*Webgate Icis (Internet Commerical Information System)*," pp. 1 at http://www.munet.com/MunetProductsIcisIndex.htm, "Products (WebGate ICIS Internet AMR now)," pp. 1-2 at http://www.munet.com/MunetProductsIcis.htm, products (WebGate ICIS Control Center Softwar), pp. 1-2 at http://222.munet.com/MunetProductsicis-Spec.htm.

"*muNet Demonstrates End-to-End IP-Based Energy Management System at DistribuTECH*," pp. 1-2 at http://www.munet.com/muNetNewPressReleases_020500l.htm.

"*muNet's Web Gate IRIS Deployed for Utility Trials Across US*", pp. 1-2 at http://www.munet.com/muNetNewPressReleases121300.htm.

"*muNet's WebGate System Finds a Home on the Internet*," pp. 1-2 at http://www.munet.com/muNetNewPressREleases031899.htm.

F. Momal, C. Pinto-Pereira "Using World-Wide-Web for Control Systems," AT Division CERN, 1211 Geneva 23, International Conference on Accelerator and Large Experimental Physics Control Systems, 1995, available at http://mish231.cern.ch/Docs/ICALEPCS/1995/icalep95.htm, (last accessed Jul. 8, 2002).

F. Momal, J. Brahy, R. Saban, P. Sollander, "Integrating a Commercial Industrial Control System to the Accelerator Control System", Proc. ICALEPCS 1993 Berlin, p. 464.

R. Saban, P. Ciriani, A. Guiard-Marigny, H. Laeger, M. Rabany, A. Swift, "Equipment Industrially Controlled", Proc. ICALEPS 1993 Berlin, pp. 461-463.

F. Momal, D. Bienvenu, D. Brahy, D. Lavielle, R. Saban, B. Vuillerme, L. Walckiers, "A Control System based on Industrial Components for Measuring and Testing the Prototype Magnets for LHC", Proc. EPAC 94 London, pp. 2322-2324.

Corcoran, Peter J., Desbonnet, Joe, Lusted, Karl, "CEBus Network Access Via the World-Wide-Web," Proceedings of the 1996 IEEE International Conference on Consumer Electronics, Rosemont, IL, USA, Jun. 5-7, 1996.

ATI Systems, "Technical Overview: Ethernet SCAN II™ Module," Oct. 1994.

"AT&T Forms Expert Team to Design Utility Industry Solutions", press release, Jan. 23, 1995, available at http://www.lucent.com/press/0195/950123.mma.html (last accessed Jul. 11, 2002).

"TECO & IBM—The 'Smart House' is Here", press release, Apr. 13, 1995, Newsbytes Inc., available at http://filebox.vt.edu/users/mikemike/smart-house/infotrac/article4.txt (last accessed Jul. 11, 2002).

Reexamination U.S. Appl. No. 90/007,227, Patent No. 6,751,563, filed Sep. 27, 2004, Response and Declarations to Office Action mailed May 12, 2006, filed Jul. 7, 2006, 44 pages.

Class 3020 POWERLOGIC® Power Meter, Square D Groupe Schneider, Oct. 1998, 4 pgs.

Press Release, Feb. 23, 2000, entitled "Connect One and Nams create the World's First Dial-Up Energy Meter that Sends and Receives E-mail Without a Gateway," available at http://www.connectone.com/PressFiles/58_press.htm, obtained Aug. 17, 2004, 4 pgs.
Online Article, Apr. 26, 2000, entitled "Embedded Systems Conference Provides a Connection to the Web," available at http://www.technoline.com/community/ed_resource/feature_article/6341, obtained Aug. 26, 2004, 3 pgs.
Online Article, Mar. 13, 2000, entitled "Your Electricity Meter Read-Over the Internet by Newsbytes," available at http://exn.ca/stories/2000/03/13/04.asp, obtained Aug. 17, 2004, 2 pgs.
7500 ION User's Guide, Revision date Oct. 15, 1999, excerpted, 231 pgs.
7500 ION Installation & Basic Setup Instructions, Feb. 17, 2000, excerpted, 45 sheets.
Exemplary Invoices of the 7500 Meter Showing Purchase Order and Shipping Information, Dec. 16, 1999, 6 pgs.
Web Utility User Manual for Quantum and Premium, 890 USE 152 00 Version 1.0, Groupe Schneider, Oct. 1998, 18 pgs.
Jeff Tyson, "How OSI Works", available at http://computer.howstuffworks.com/osi.htm/printable , obtained Aug. 27, 2007, 2 pgs.
SCADA, from Wikipedia, the free encyclopedia, available at http:en.wikipedia.org/wiki/SCADA, obtained Aug. 27, 2007, 7 pgs.
PLC Solutions Substation Automation Transparent Utility, Schneider Electric, Jun. 1999, 4 pgs.
PLC-based Automation Electric Power Process and Substation Control Products, Schneider Electric, Apr. 1999, 16 pgs.
ABB Alpha Solid State Polyphase Meter, Product Bulletin 42-270-B, Sep. 15, 1995.
Dranetz Power Platform® PP1 & PP1E with TASKCard®-8000 Operator's Manual Revision A, Apr. 15, 1997.
Dranetz Power Platform® 4300 with TASKCard® 808 User's Guide, pp. ii-146, Jul. 1998.
Deposition of Erich W. Gunther, pp. 1-250, Nov. 14, 2008.
Dranetz Brochure, "Total Electrical System Management 8000-2", pp. 1-3.
Dranetz Power Platform® PP1 and PP1E TASKCard®-PQPLUS Operators Manual Revision A, Apr. 15, 1997.
Dranetz Brochure, "Tomorrow's Technology Working for You Today", pp. 1-11, 1994.
BMI Brochure, "PowerProfiler™ 3030(A)", pp. 1-2, 1994.
BMI 3030/3060 Power Profiler User's Guide, pp. 1-8, 1990.
Dranetz OM-PC-PP1 PC PP1 Communication and Analysis Software Operator's Manual, pp. 1-6, Mar. 15, 1994.
Dranetz Brochure, "Power Platform® PP1-R", pp. 1-2.
DRAN-SCAN® 2000 Version 3.x, Power Quality Monitoring System Installation and Startup Guide, pp. ii-43, Nov. 1998.
Dranetz Power Platform® PP1-R User's Guide Revision A, Nov. 1998.
Dranetz Brochure, "Power Platform 4300 with TASKCard 808 Demand/Energy and Harmonic Analysis", pp. 1, 1996.
Dranetz Power Platform® Model 4300 TASKCard® PQLite Operator's Manual Revision A, Jan. 15, 1997.
Dranetz Power Platform® 4300 TASKCard® PQLite User's Guide Revision B, May 1, 2002.
7100/7100S PQNode® User's Guide, pp. iii-33, 1998.
8010 PQNode User's Guide, Revision A, pp. iii-33, 1998.
Power Measurement Ltd., 3720 ACM Advanced Power Instrumentation Package, pp. 1-12, Sep. 14, 1992.
Brochure, Model 3600A Power Line Disturbance Monitor, pp. 1-5.
Liebert Brochure, Model 3600A Portable Programmable Power Line Disturbance Monitor, pp. 1-2, 1985.
Franklin Electric Service Manual for Model 3600 Power Line Disturbance Monitor, pp. 1-28.
Brochure, "DataNodes™ EPQ Series, A Clear and Open Window to Enhanced Power Quality, Energy and More", pp. 1.
Melhorn et al., "Accessing Power Quality Information and Monitoring Results Using the World Wide Web or a Private Corporate Web", pp. 1-12.
Dranetz Series 5500 InfoNode® User's Guide Revision D, 1999.
Signature Systemtm™ Brochure, "Information. Knowledge. Power.", pp. 1-9, 1999.
Dranetz Series 5500 DualNode User's Guide Revision C, 2002.
Dranetz EPQ DataNode® Series User's Guide Revision D, 2000.
Dranetz Power Platform, PP1 SM-PP1 Service Manual, Feb. 1, 1995.
Dranetz Power Platform 4300 Service Manual, Revision B, May 1, 2002.
kV S-Base Meters, pp. 1-2, Sep. 1999.
GE kV Vector Electricity Meter, Product Description, Option Board Installation Procedures, Operating Instructions, Maintenance Instructions and Cite Analysis Guides, 1997.
Manual, "kV Vector Electricity Meter with the Site Genie Monitor".
Gunther et al., "Application of Advanced Characterization Alogrigthms, UCA and Internet Communications Technology At the Point of Power Quantity and Quality Measurement", *Presented at EPRI 1999 PQA Conference*, Charlotte, NC, pp. 1-16, 1999.
Gunther et al., "Application of Advanced Alogrigthms and Internet Communications Technology at the Point of Power Measurement," http:/www.pqmonitoring.com/papers/ieee99sm/, IEEE Summer Meeting 1999, Jul. 20, 1999, 23 pages.
Dranetz Series 5500 InfoNode User's Guide, Revision D, 2000.
Dranetz Power Evaluation Software User's Guide, Revision H, 2000.
Dranetz Brochure, "Series 626 Universal Disturbance Analyzer", pp. 1-16.
Dranetz 8800 PowerScope® User's Guide, 1992.
Manual, "TM-115000-G1 vol. 2-Service Manual Model 658 Power Quality Analzyer, Revision A," Mar. 1, 1995.
Dranetz 658 PQ Analyzer User's Guide, Revision A, Feb. 15, 1997.
Dranezt Brochure, "Power Platform 4300 Handheld Power Analysis", pp. 1-6, 1995.
"Electronic Energy Meter with Powerline Modem on DSP56F80x", Preliminary Information Application Brief, pp. 1-2, 2000.
Square D Bulletin, "Powerlogic® Series 4000 Circuit Monitor", pp. 1-6, Apr. 2000.
Square D Bulletin, "Powerlogic Ethernet Communication Card", pp. 1-2, Aug. 2000.
"Powerlogic® Advanced Power Reliability Solutions," Square D Schneider Electric, brochure, 2000, 6 pages.
"Powerlogic® Circuit Monitor—Series 2000," Class 3020, Square D Schneider Electric, brochure, 6 pages.
"Powerlogic® Power Meter," Class 3020, Square D Schneider Electric, brochure, 1998, 3 pages.
"Powerlogic® Metering and Monitoring Devices," Square D Schneider Electric, brochure, 2000, 3 pages.
"Powerlogic® Power Monitoring and Control System," Square D Schneider Electric, brochure, 1998, 8 pages.
"Powerlogic® Series 4000 Circuit Monitor," Square D Schneider Electric, brochure, 2000, 4 pages.
"Digest," Square D Schneider Electric, product catalog, Mar. 2000, 10 pages.
"Powerlogic® Series 4000 Circuit Monitor Now Available with Ethernet Communications Card," Square D Schneider Electric, News Release, Jul. 20, 2000, 2 pages.
"Powerlogic® Ethernet Communications Card," Square D Schneider Electric, Instruction Bulletin, Sep. 2000, 59 pages.
"Powerlogic® Series 4000 Circuit Monitor," Square D Schneider Electric, brochure, Apr. 2000, 6 pages.
"Powerlogic® Ethernet Communication Card," Square D Schneider Electric, brochure, Aug. 2000, 2 pages.
"Powerlogic® Ethernet Communication Card," Square D Schneider Electric, brochure, Nov. 2004, 2 pages.
"Powerlogic® Circuit Monitor Series 4000, Instruction Bulletin No. 63230-300-200, Feb. 2000 Now Available with Ethernet Communications Card" Square D Schneider Electric, News Release, Jul. 20, 2000, 282 pages.
"Powerlogic® Ethernet Communications Card," Schneider Electric, Instruction Bulletin No. 63230-304-200, Sep. 2000, 70 pages.
"Powerlogic® Circuit Monitor Series 4000 Installation Manual," Schneider Electric, Instruction Bulletin No. 63230-300-209B1, Dec. 2005, 110 pages.
"Powerlogic® Circuit Monitor Series 4000 Installation Manual," Schneider Electric, Instruction Bulletin No. 63230-300-212B1, Dec. 2005, 234 pages.
"Powerlogic® Ethernet Communications Card," Schneider Electric, Instruction Bulletin No. 63230-314-202A4, Jan. 2006, 14 pages.

"Powerlogic® Ethernet Communications Card," Schneider Electric, Instruction Bulletin No. 63230-304-204A4, Jan. 2006, 46 pages.

"GE kV2 Multifunction Electricity Meter," GE Industrial Systems, GEH-7277, Product Description, Operating Instructions, Maintenance Instructions, Upgrading, Site Analysis Guides, Diagrams, Dec. 2000.

Report of Richard Bingham dated Jun. 18, 2009 (pp. 1-56 of 71 (56 pages), and Appendix A (9 pages) (65 pages total)).

Report of Michael O. Warnecke dared May 27, 2009.

"Powerlogic® Power Meter," Class 3020, Square D Schneider Electric, brochure, 1998, 4 pages.

"Powerlogic® Metering and Monitoring Devices," Square D Schneider Electric, brochure, 2000, 4 pages.

"Powerlogic® Series 4000 Circuit Monitor," Square D Schneider Electric, brochure, 2000, 6 pages.

"PowerPlus Alpha® Meter," *ABB Network Partner*, brochure (May 1997) (6 pages).

QUAD4® Plus/MAXsys™ *Products User's Guide*, Chapter 1 Overview (2 pages).

"Alpha Stars™, National Wireless Communications for Remote Metering," *ABB Information Systems*, Bulletin (24 pages).

"AIN Alpha, High Function Multi-Tariff Solid State Electricity Meter," *ABB Network Partner*, PB 42-280-Ib, pp. 1-20.

"Alpha Solid State Polyphase Meter (Watts, VARs, VA)," *ABB Network Partner*, Product Bulletin, Sep. 15, 1995 (12 pages).

"POWERLOGIC® Series 4000 Circuit Monitor," Square D/Schneider Electric, Bulletin No. 3020HO0001, Apr. 2000 (6 pages).

"Web-Enabled Power Management Solutions," Square D/Schneider Electric, Product Brochure, Jan. 2002 (8 pages).

* cited by examiner

INTELLIGENT ELECTRONIC DEVICE HAVING NETWORK ACCESS

RELATED APPLICATIONS

This application claims priority as a continuation under 37 C.F.R. §1.53(b) of U.S. patent application Ser. No. 10/712,960 entitled "INTELLIGENT ELECTRONIC DEVICE HAVING NETWORK ACCESS", filed Nov. 13, 2003, now U.S. Pat. No. 7,415,368, which is a continuation under 37 C.F.R. §1.53(b) of U.S. patent application Ser. No. 09/792,701 entitled "Systems for the In Field Configuration of Intelligent Electronic Devices", filed Feb. 23, 2001, now U.S. Pat. No. 7,085,824, both of which are hereby incorporated by reference. This application is further related to U.S. patent application Ser. No. 11/899,769, entitled "INTELLIGENT ELECTRONIC DEVICE HAVING NETWORK ACCESS", filed Sep. 6, 2007, published as U.S. Patent Application Publication No. 2008/0046205 A1, herein incorporated by reference. U.S. patent application Ser. No. 09/792,701 incorporates by reference the following U.S. Patent Applications which relate to and further describe other aspects of the embodiments disclosed in the present application and are also incorporated by reference herein:

U.S. patent application Ser. No. 09/791,340, "SYSTEM AND METHOD FOR MANUFACTURING AND CONFIGURING INTELLIGENT ELECTRONIC DEVICES TO ORDER", filed Feb. 23, 2001, now U.S. Pat. No. 6,853,978;

U.S. patent application Ser. No. 09/792,699, "SYSTEMS FOR IMPROVED MONITORING ACCURACY OF INTELLIGENT ELECTRONIC DEVICES", filed Feb. 23, 2001, now U.S. Pat. No. 6,671,635; and U.S. patent application Ser. No. 09/791,421, "MULTI-FEATURED POWER METER WITH FEATURE KEY", filed Feb. 23, 2001, now U.S. Pat. No. 7,249,265.

BACKGROUND

Monitoring of electrical energy by consumers and providers of electric power is a fundamental function within any electric power distribution system. Electrical energy may be monitored for purposes of usage, equipment performance and power quality. Electrical parameters that may be monitored include volts, amps, watts, vars, power factor, harmonics, kilowatt hours, kilovar hours and any other power related measurement parameters. Typically, measurement of the voltage and current at a location within the electric power distribution system may be used to determine the electrical parameters for electrical energy flowing through that location.

Devices that perform monitoring of electrical energy may be electro-mechanical devices, such as, for example, a residential billing meter or may be intelligent electronic devices ("IED"). Intelligent electronic devices typically include some form of a processor. In general, the processor is capable of using the measured voltage and current to derive the measurement parameters. The processor operates based on a software configuration.

The software configuration is typically instruction sets stored in the intelligent electronic device. The instruction sets may be software, firmware or some other form of operating code and includes device specific data used to configure a particular intelligent electronic device. The software configuration of an intelligent electronic device is used during monitoring of the electrical energy and the derivation of measured parameters. Typically, the software configuration of an intelligent electronic device is determined during manufacturing.

Following installation of the intelligent electronic device in the field, additional site-specific data may be entered to complete or modify the configuration based on the operational functionality desired.

A typical consumer or supplier of electrical energy may have many intelligent electronic devices installed and operating throughout their operations. The intelligent electronic devices may operate individually, or may operate as part of a monitoring system. Each of the intelligent electronic devices may require unique software configurations, or multiple devices may include the same software configuration.

In the prior art, modification of the software configuration of previously installed and operating devices may be a tedious and labor-intensive task. Prior art intelligent electronic devices are reconfigured individually. Individual reconfiguration may involve manually inputting data and instruction sets into the device at the site where device is installed (e.g., in the field). Similarly, in those prior art devices that include remote communication via a modem, each intelligent electronic device must be individually contacted and changes to the configuration initiated via the modem connection. Where it is desirable to revise the software configuration of a large number of intelligent electronic devices, the length of time required to perform the revisions greatly increases. Further, maintaining a record of the current software configuration of an intelligent electronic device may be difficult. Accordingly, a need exists for systems capable of performing efficient modification of the software configuration of multiple intelligent electronic devices and maintaining a record of the current software configurations.

DETAILED DESCRIPTION OF THE PREFERRED EMBODIMENTS

The present embodiments disclose a system for performing modification of the software configuration of intelligent electronic devices that are installed in the field. The modification may be performed on an individual intelligent electronic device. In addition, groups of intelligent electronic devices may be identified for modification. Further, a copy of the software configuration of the intelligent electronic devices may be maintained in a database. Upgrades or changes to the software configuration of an intelligent electronic device may be performed with the database followed by transfer of the changes to the intelligent electronic device. Conversely, changes at the intelligent electronic device may be transferred to the database.

The present embodiments also disclose a system for improving the accuracy of measurement of electrical energy using metering sensors. Improved accuracy may be realized by developing characteristic curves based on actual operating conditions with the metering sensors. The characteristic curves may be used by an intelligent electronic device to improve overall accuracy. The characteristic curves may be generated by the intelligent electronic device or generated and transferred to the intelligent electronic device.

Figure 1:
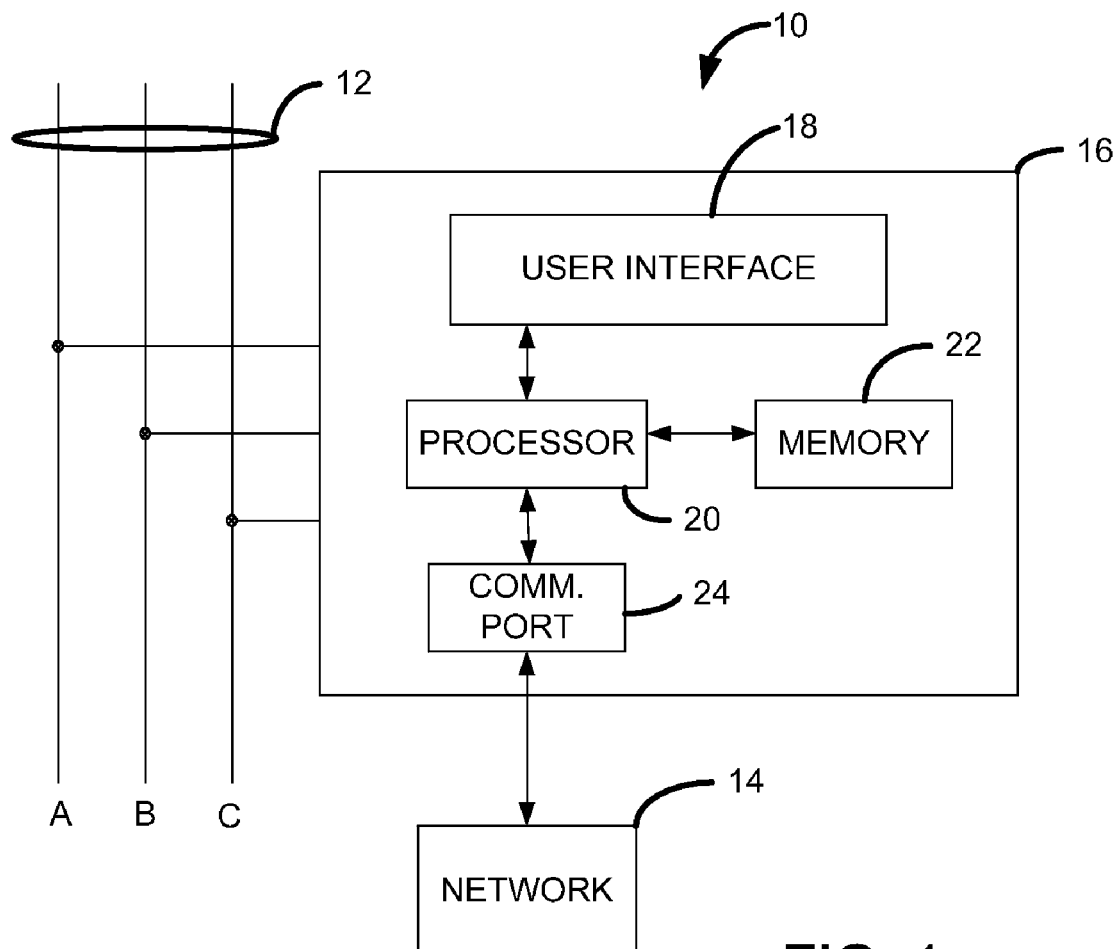
FIG. 1 is a block diagram of a portion of a power distribution system that includes one embodiment of an intelligent electronic device.

FIG. 1 illustrates a block diagram representation of an embodiment of a portion of a power distribution system 10. The power distribution system 10 includes a plurality of conductors 12, a network 14 and at least one intelligent electronic device (IED) 16. The conductors 12 and the network 14 may be connected with the IED 16 as illustrated. As used herein, the term "connected" or "coupled" may mean electrically connected, optically coupled or any other form of coupling allowing the flow of data, electricity or some representation thereof between devices and components that are connected or coupled. The conductors 12 may be, for example, electric transmission lines, electric distribution lines, power cables, bus duct or any other material capable of conducting electrical energy. The conductors 12 are operable to allow the flow of electrical energy therethrough. The conductors 12 are illustratively depicted in FIG. 1 in a three-phase circuit configuration; however the phase configuration is not limited to three-phases.

The network 14 may be the Internet, a public or private intranet, an extranet, or any other network configuration to enable transfer of data and commands. An example network configuration uses the Transport Control Protocol/Internet Protocol ("TCP/IP") network protocol suite, however, other Internet Protocol based networks are contemplated. Communications may also include IP tunneling protocols such as those that allow virtual private networks coupling multiple intranets or extranets together via the Internet. The network 14 may support application protocols, such as, for example, telnet, POP3, Mime, HTTP, HTTPS, PPP, TCP/IP, SMTP, proprietary protocols, or any other network protocols known in the art. During operation, the IED 16 may communicate using the network 14 as will be hereinafter discussed.

The IED 16 may be a programmable logic controller (PLC), a remote terminal unit (RTU), an electronic power meter, a protective relay, a fault recorder or other similar intelligent device installed in the field and capable of monitoring electrical energy. In addition, the IED 16 may perform other functions such as, for example, power distribution system protection, management of power generation, management of energy distribution and management of energy consumption. In one embodiment, the IED 16 includes a user interface 18, a processor 20, a memory 22 and a communication port 24 connected as illustrated in FIG. 1. It will be appreciated that the IED 16 may include other hardware components such as, for example, metering sensors, power supplies, signal processing circuits, logic circuits or any other hardware useful in performing electrical energy monitoring. As used herein, the term "IED" may be used interchangeably with the term "IEDs." For example, the term "IED" may be used to discuss aspects involving one IED 16 and "IEDs" may be used to discuss aspects involving multiple IEDs 16.

During operation of the power distribution system 10, the IED 16 monitors the electrical energy flowing within the conductors 12. The IED 16 may process the electrical energy to derive, store and display data for various electrical parameters indicative of the electrical energy flowing in the conductors 12. The IED 16 may also provide outputs to, and receive inputs from, the power distribution system 10. Processing within the IED 16 may be performed with a software configuration. As will be hereinafter described, the software configuration within the IED 16 may be modified remotely without removing the IED 16 from service. In addition, the software configuration may be modified locally using the user interface 18.

The user interface 18 may include one or more buttons, levers, switches, display screens, keypads, touch screens or any other device(s) capable of providing an interface to a user of the IED 16. As illustrated in FIG. 1, the user interface 18 is connected with, and acts as an interface to, the processor 20. As such, the user interface 18 may provide display of the electrical parameters derived by the processor 20. In addition, commands for the processor 20 may be entered using the user interface 18.

The processor 20 may be, for example, a microprocessor, an electronic control unit or any other device capable of executing instructions, monitoring electrical inputs and providing electrical outputs. The processor 20 may perform calculations, operations and other logic related tasks to operate the IED 16. In one embodiment, the processor 20 may operate as a function of the software configuration. The software configuration may be stored in the memory 22 connected with the processor 20. The processor 20 and the memory 22 cooperatively operate to form the central processing unit (CPU) for the IED 16.

The memory 22 may be a non-volatile memory, such as for example a flash memory device or other similar memory storage device in communication with the processor 20. The memory 22 may store the electrical parameters derived by the IED 16 during operation. The memory 22 may also store the software configuration of the IED 16. In addition, the memory 22 may be used to store other information pertaining to the functionality or operation of the IED 16 or the network 14.

In another embodiment, the memory 22 may include both non-volatile memory and volatile memory. The memory 22 may store a first portion of the software configuration in the non-volatile memory and a second portion of the software configuration in volatile memory. In this embodiment, the volatile memory may be is used to limit the amount of more costly non-volatile memory required. The first portion of the software configuration may include instructions that instruct the IED 16 to retrieve the second portion of the software configuration from another location. As such, when power is applied to activate the IED 16, the instructions in the non-volatile memory are executed and the remaining software configuration is transferred from the remote location (as later discussed) to the non-volatile memory.

In the presently preferred embodiments, the software configuration includes firmware software and applications software. Firmware is the low level operating code providing the basic functionality, or operating capability of the IED 16. The firmware may be referred to as an operating system of the IED 16. The firmware may include standard as well as optional components to support the basic functions of the IED 16.

The applications software may include one or more software programs designed to derive, display, utilize and manipulate the data within the IED 16. Applications software may include measurement and recording applications, derivation applications, measurement and control applications, communications applications and any other applications providing functionality to the IED 16. The applications software may also include standard applications software and custom applications software. Standard applications software includes those applications developed by the manufacturer that may be provided as standard functionality within the IED 16. Standard applications software typically performs the more usual and customary functions for which the IED 16 is designed.

Custom applications software includes those applications specifically tailored to the needs of an end user, or group of end users operating the IED 16 in the field. Any applications software that is not "off the shelf" software may be considered custom applications software. Custom applications software may be developed by the end users, third parties or by the manufacturer of the IED 16.

In the one embodiment, the applications software may be organizationally described as a plurality of frameworks. The frameworks may be an object oriented software architecture allowing the organization of the various operations performed by the IED 16. Accordingly, each of the frameworks in a software configuration may represent one or more parts of the applications software. For example, a framework identified as a setpoint framework may contain operating instructions for the IED 16 pertaining to setpoints for the various electrical parameters derived by the IED 16. Other exemplary frameworks may include, a historic data logging framework, a harmonic measurement framework, a display framework, a digital inputs framework, an alarm framework, a revenue framework or any other framework representing some portion of the functionality of the IED 16.

The software configuration of this embodiment may be comprised of the firmware and the frameworks. The frameworks may represent both applications software, referred to as "Core" frameworks, and custom applications software, referred to as "Custom" frameworks. Accordingly, the IED 16 is a highly customizable device capable of performing a wide variety of monitoring and power management functions. While the IED 16 may utilize the object oriented framework architecture, it will be appreciated that the applications software may also be developed in non-object oriented format and still provide a highly customizable device.

Each of the frameworks of one embodiment includes a plurality of modules. The modules may operate within an object oriented software construct known as an integrated object network (ION™) that will be hereinafter discussed. Development of a framework may be accomplished by linking several modules together. The modules may represent logic tasks performed to manipulate, derive, store, transfer or otherwise process data. The data input to the modules may be received by the framework from data inputs to the IED 16, or may be the data output from another framework. An IED 16 may have several frameworks operating independently or in combination with other frameworks to perform various management, control, derivation, storage communication and/or other functions of the IED 16. In one embodiment, the frameworks may be created in a software design tool called "ION™ Designer." "ION™ Designer" is a component of a PEGASYS™ software system manufactured by Power Measurement Ltd., located in Saanichton, B.C., Canada.

Figure 2:
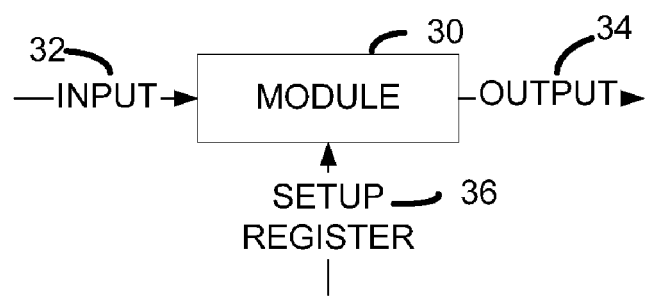
FIG. 2 depicts an exemplary embodiment of a module operating within the intelligent electronic device illustrated in FIG. 1.

FIG. 2 depicts an example of a module 30 operating within a framework (not shown) of the IED 16 (FIG. 1). The module 30 includes at least one input 32, at least one output 34 and at least one setup register input 36. The quantity and signal type of the inputs 32, the outputs 34 and the setup register inputs 36 are dependent on the function of the module 30. The setup register inputs 36 may include configuration settings for the module 30. The configuration settings determine how the module 30 processes the data received on the inputs 32 and generates data on the outputs 34.

The module 30 may be designated to perform any of a number of functions within one of the frameworks. For example, the module 30 may be an Arithmetic Module that performs mathematical and logical functions such as multiplication, addition, square root, etc. to data supplied on the inputs 32 and provides the result on the outputs 34. Further examples may include a Display Module that allows for the creation of custom front panel display screens and a Sag/Swell Module that monitors the voltage inputs for disturbances and, upon detection of a disturbance, breaks the disturbance into discrete components to perform a more detailed analysis. Further exemplary modules of one embodiment may be found in an "ION™ Reference Manual", printed by Power Measurement Ltd., located in Saanichton, B.C., Canada.

Figure 3:
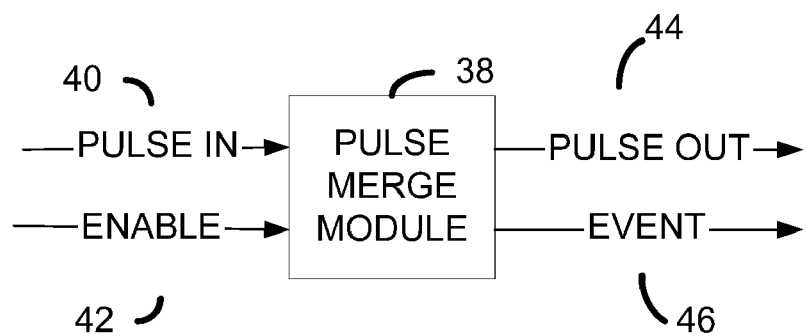
FIG. 3 depicts another exemplary embodiment of a module operating within the intelligent electronic device illustrated in FIG. 1.

FIG. 3 is an exemplary embodiment of a Pulse Merge (PM) Module 38 operating within a framework (not shown) of the IED 16 (FIG. 1). The PM module 38 receives at least one pulse input signal on at least one pulse input line 40. The pulse input signals may be from an external input (not shown) to the IED 16, or from one or more other modules (not shown). The PM module 38 may commence with processing the pulse input signals upon receipt of an enable signal on an enable line 42. Following processing, the PM module 38 may provide at least one pulse output signal on at least one pulse output line 44. The pulse output signals may be an input to another module within the frameworks or may be an external output from the IED 16. The processing of the pulse input signals may be functions such as, for example, an AND, OR, NOT, or any other Boolean function. In addition, the PM module 38 may further process the pulse output signals to generate an event output signal on an event output line 46. The event output signal may, for example, be written to an event log or trigger further processing in the IED 16. In this embodiment, the PM module 38 does not require configuration settings and therefore no setup register lines are included.

Figure 4:
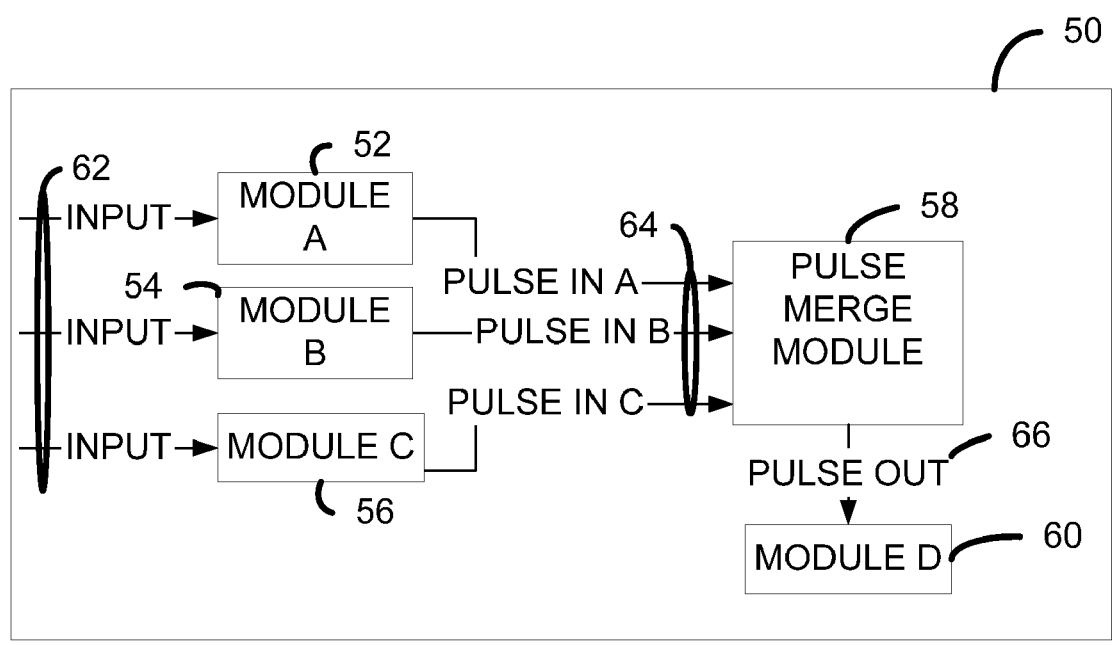
FIG. 4 depicts an exemplary embodiment of a framework that includes the modules depicted in FIGS. 2 and 3.

FIG. 4 is an exemplary embodiment of a portion of a framework 50 within the IED 16 (FIG. 1). The framework 50 includes a Module A 52, a Module B 54, a Module C 56, a Pulse Merge (PM) Module 58 and a Module D 60 that are connected as illustrated. The Modules A-D 52, 54, 56, 58 are similar to the module 30 previously discussed with reference to FIG. 2. In addition, the PM Module 58 is similar to the PM module 38 previously discussed with reference to FIG. 3.

In the exemplary embodiment, Modules A, B and C 52, 54, 56 may be Maximum Modules each configured to monitor an input line 62 for input signals. During operation, if one of the input signals reaches a pre-set value, the corresponding Module 52, 54, 56 may output an output pulse signal on a corresponding output line 64. The PM module 58 may monitor the output lines 64, and upon receipt of one of the output pulse signals may generate an output pulse signal on an output pulse line 66. Module D 60 may monitor the output pulse line 66. Module D 60 may be an Alert Module configured to provide an electrical signal alerting that a maximum value has been reached. It should be realized that the above-described exemplary embodiment is merely one example of a portion of one framework and numerous other frameworks as well as module configurations are possible.

In the presently preferred embodiments, the frameworks may utilize the data generated by other frameworks within the IED 16, or external signals provided to the IED 16, to produce useful results and/or perform useful functions. Frameworks ultimately create and allow manipulation of the functionality of the IED 16. The ease of creation and manipulation permits, as well as promotes, customization and expansion of the IED 16. As such, the functionality of the IED 16 may be modified by simply changing or adding frameworks to the device.

The highly customizable and configurable nature of the IED 16 lends itself to solutions satisfying the specific needs of a user's power management applications. However, this requires the user of the IED 16 to configure and tailor the frameworks to their needs. It would be impractical for the manufacturer to offer every conceivable combination of options and software. Further, the capabilities of the IED 16 make it almost impossible to predict the functionality desired by each user. It is therefore desirable to provide a system through which a customer can customize, edit and update the software configuration of one or more IEDs 16 that are previously installed and operating in the field.

The IEDs 16 may also include an identifier to uniquely identify each of a plurality of IEDs 16 (not shown). Alternatively, the identifier may uniquely identify a predetermined group of IEDs 16. Further, an IED 16 may include a number of identifiers both for unique identification as well as for any number of predetermined groups. The identifiers may, for example, be an identification number, such as, a serial number or a part number. Alternatively, the identifiers may be letters, numbers or a combination of both. The manufacturer may determine the identifiers for an IED 16 or a predetermined group of IEDs 16. Alternatively, a user may develop identifiers following installation in the field.

Referring again to FIG. 1, the IED 16 also includes the communication port 24. The communication port 24 may be, for example, an Ethernet card, a network interface card or some other network compatible communication device capable of creating a communication link. In addition, the communication port 24 may include wireless communication capability, such as, for example, a wireless transceiver (not shown). The communication port 24 may operatively cooperate with the processor 20 to format and pass commands and information. The IED 16 may send and receive data and commands using transfer protocols, such as, for example, file transfer protocols (FTP), Simple Object Access Protocol (SOAP), Extensible Markup Language (XML) or any other protocols know in the art.

The communication port 24 of one embodiment allows the IED 16 to be a node on the network 14. The IED 14 communicates with other nodes on the network 14. The other nodes on the network 14 may be other network devices such as, another IED 16, a server, or any other central processing unit (CPU) operable to communicate over the network 14. As such, the IED 16 is capable of peer-to-peer communication with other IEDs 16 as well as communication with other CPUs communicatively coupled with the network 14.

Figure 5:
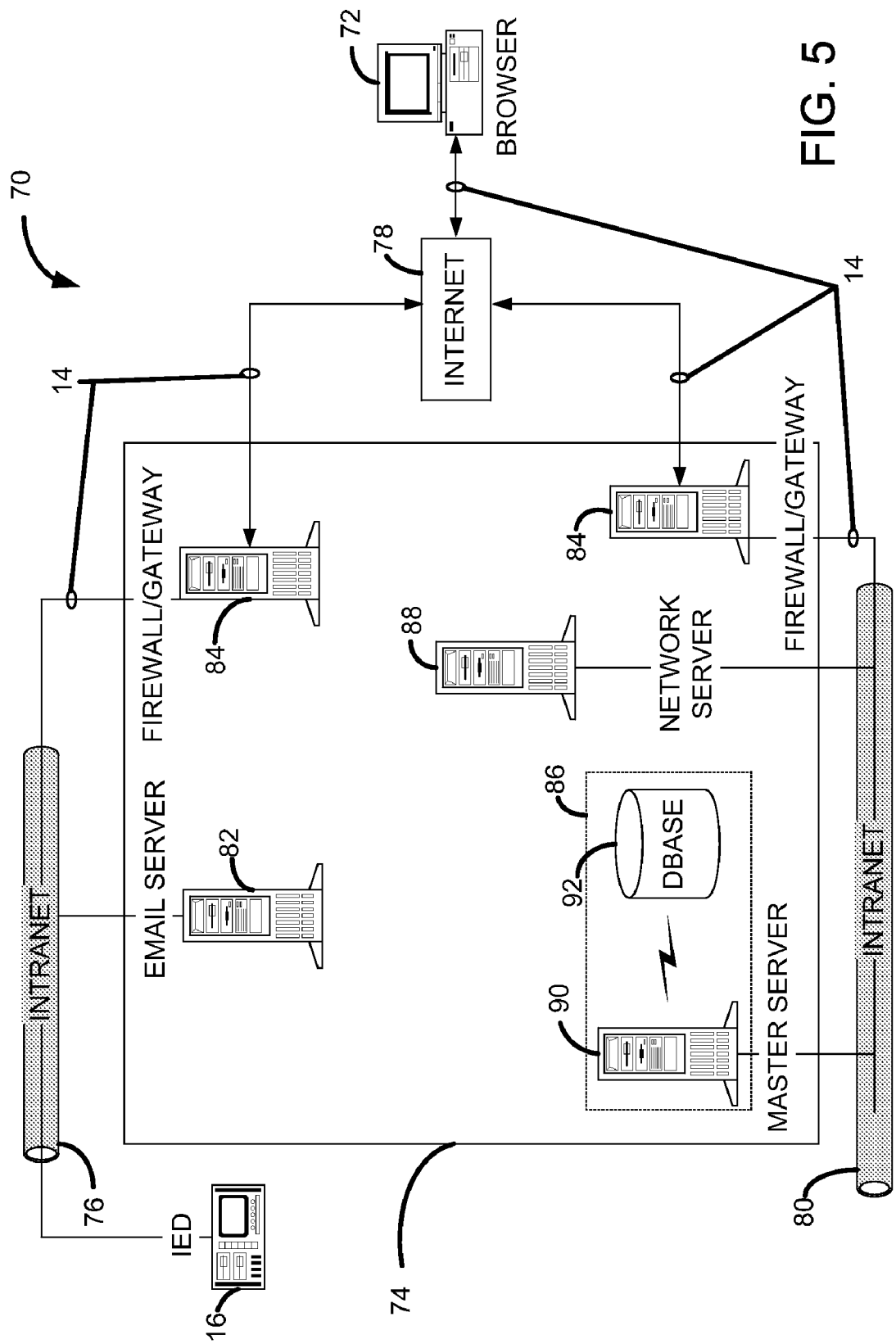
FIG. 5 is a block diagram of one embodiment of a portion of a network distribution system that includes the intelligent electronic device illustrated in FIG. 1.

FIG. 5 illustrates a portion of one embodiment of a network distribution system 70. The network distribution system 70 includes at least one IED 16, at least one browser 72 and a plurality of servers 74 forming nodes on the network 14. The nodes are connected and operatively communicating with each other over the network 14 as illustrated. In the illustrated exemplary network distribution system 70, the network 14 includes components of a first intranet 76, an Internet 78 and a second intranet 80. Communication within network 14 may be performed with a communication medium that is included in wireline based communication systems and/or wireless based communication systems. The communication medium may be for example, a communication channel, radio waves, microwave, wire transmissions, fiber optic transmissions, or any other communication medium capable of transmitting data in wireline and wireless based communication systems.

The number and configuration of the components forming the network 14 are merely an illustrative example, and should not be construed as a limitation on the almost unlimited possibilities for configuration of the network 14. In addition, hardware within the network 14 may perform one or more of the functions described herein, as well as other well-known network functions, and therefore should not be construed as limited to the configuration described. For example the function performed by the servers 74 are illustratively described as different servers for purposes of clarity, however a single server, or more than one server may perform the functions of the servers 74. Further, the general form of the architecture is connectionless thereby allowing for substantially simultaneous communications between a substantial number of devices, such as, for example, multiple IEDs 16 and browsers 72 within the network distribution system 70. This form of scalability eclipses architectures that utilize point-to-point connections, such as, for example, those provided by telephony networks where a limited number of simultaneous communications may take place.

In the embodiment illustrated in FIG. 5, the IED 16 may communicate via the first intranet 76. As generally known in the art, intranets are comprised of software applications and various computing devices (network cards, cables, hubs, routers, etc.) that are used to interconnect various computing devices and provide a communication path. The term "intranet," as used herein, should be broadly construed to include any and all hardware and software applications that allow the IEDs 16, the browser 72, the servers 74 and other computing devices to be communicatively coupled to share and transfer data and commands. Intranets are not limited to a particular physical location and may include multiple organizations using various communication protocols. Although not illustrated, other devices, such as, for example, printers may be connected with the intranet 76, 80 to make these devices available to users of the network 14. As known in the art, various types of intranets 76, 80 exist and may be used with the presently preferred embodiments.

The browser 72 may be any application running on a CPU that is capable of communicating over the network 14. The browser 72 may be an Internet browser, proprietary software or any other application capable of forming a connection with the servers 74 to send and receive information. In addition, the browser 72 may be capable of sending data to, and receiving data from, the IED 16. The browser 72 may include an intranet, a server or any other devices and applications discussed herein to interface with and communicate via the Internet 78.

The servers 74 are the primary interface to clients, such as, for example, the IED 16 and the browser 72, for all interactions with the applications or services available within the network distribution system 70. The servers 74 may operate to authenticate the clients, establish a secure connection from the clients to the servers 74, and allow applications the clients are using to transparently access other resources of the network distribution system 70. In another embodiment, the IED 16 may perform some or all of the functions of the servers 74. In the exemplary embodiment, the servers 74 include at least one email server 82, a plurality of firewall/gateway servers 84, at least one master server 86 and a network server 88. The master server 86 further comprises a master server machine 90 and a database 92 in operable communication with each other. In other embodiments, additional servers, fewer servers or an individual server may be used to fulfill these functions.

The email server 82 may be any CPU that includes associated communications hardware and an application capable of handling incoming and outgoing mail for the first intranet 76. An example embodiment is a computer that operates with Single Mail Transfer Protocol (SMTP) and Post Office Protocol 3 (POP3) using applications, such as, for example, MICROSOFT WINDOWS NT and MICROSOFT EXCHANGE SERVER. The email server 82 communicates over the network 14 using the first intranet 76.

The firewall/gateway servers 84 may be a CPU that provides a network interfacing function, an application launching function and a firewall function. In the network interfacing function, the firewall/gateway servers 84 may be responsible for controlling traffic on the intranet 76, 80 and the interface with the Internet 78. In addition, the firewall/gateway servers 84 may include applications that can be launched by users of the intranet 76, 80 and the Internet 78. An example traffic controlling function is accepting incoming HTTP (Hypertext Transfer Protocol) messages and fulfilling the requests embedded therein. Another example would be receiving dynamic HTML (Hypertext Markup Language) page generation requests and launching the appropriate applications to fulfill those requests. Other transfer protocols, such as file transfer protocols (FTP), Simple Object Access Protocol (SOAP), Extensible Markup Language (XML) or other protocols known in the art may also be controlled by the firewall/gateway servers 84.

In the application launching function, the firewall/gateway servers 84 may include applications to manage the logical flow of data and commands and keep track of the state of sessions. A session is a period of time in which the IED 16 or the browser 72 is interacting with, and using the network distribution system 70. Other applications operating within the firewall/gateway servers 84 may include encryption and decryption software. Exemplary encryption and decryption software encrypts commands transmitted across the network 14, and decrypts data received from the network distribution system 70. In one embodiment, encryption may be done utilizing Pretty Good Privacy (PGP). PGP uses a variation of public key system, where each user has a publicly known encryption key and a private key known only to that user. The public key system and infrastructure enables users of unsecured networks, such as the Internet 78, to securely and privately exchange data through the use of public and private cryptographic key pairs.

Authentication applications may also be included in the firewall/gateway servers 84. Authentication applications may be performed for commands or data sent or received over the network 14. Authentication is the process of determining and verifying whether the device transmitting data or commands is the device it declares itself to be. In addition, authentication prevents fraudulent substitution of devices or spoofing of device data generation in an attempt to defraud. Parameters such as time/date stamps, digital certificates, physical locating algorithms such as cellular triangulation, serial or tracking ID's, which could include geographic location such as longitude and latitude may be parameters included in authentication. Authentication may also minimize data collection and control errors within the network distribution system 70 by verifying that data is being generated and that the appropriate devices are receiving commands.

The firewall function performs network security by isolating internal systems from unwanted intruders. In the example embodiment, the firewall/gateway server 84 for the first intranet 76 may isolate the IED 16, the email server 82 and the firewall/gateway server 84 from all Internet traffic that is not relevant to the operation of the network distribution system 70. In this example, the only requests allowed through the firewall may be for services pertaining to the IED 16, the email server 82 and the firewall/gateway server 84. All requests not validated and pertaining to the IED 16, the email server 82 and the firewall/gateway server 84 that are received from the Internet 78 may be blocked by the firewall/gateway server 84.

As used herein, the term Internet 78 should be broadly construed to include any software application and hardware device that is used to connect the IED 16, the browser 72 and the servers 74 with an Internet service provider (not illustrated). The Internet service provider may establish the connection to the Internet 78. The IED 16, the browser 72 and the servers 74 may establish a connection to the Internet 78 with the Internet service provider using, for example, modems, cable modems, ISDN connections and devices, DSL connections and devices, fiber optic connections and devices, satellite connections and devices, wireless connections and devices, Bluetooth connections and devices, two-way pagers or any other communication interface device. For the purpose of the presently preferred embodiments, it is important to understand that the IED 16, the browser 72 and the servers 74 may operatively communicate with one another through the Internet 78.

The master server machine 90 of the master server 86 may be any CPU in communication with the database 92. The master server machine 90 runs applications that store, maintain and allow interface to the data within the database 92. Applications, such as, for example, a database management system (DBMS) or other similar application may organize and coordinate the storage and retrieval of data from the database 92. The database 92 may be stored in a storage device, such as, for example, at least one hard drive, an optical storage media, or any other data storage device allowing read/write access to the data. The data in the database 92 may be communicated by the master server machine 90 throughout the network distribution system 70 using the network 14. The data within the master server 86 may be centralized on one master server 86 or may be distributed among multiple master servers 86 that are distributed within the network distribution system 70.

In one embodiment of the master server 86, the database 92 may include one or more datafiles that include frameworks. In addition, the database 92 may include one or more datafiles that include software configurations. As previously discussed, the software configuration may include both firmware and frameworks. The database may also include characteristic curves for each of the IEDs 16 as disclosed in the above captioned U.S. Patent Application entitled SYSTEMS FOR IMPROVED MONITORING ACCURACY OF INTELLIGENT ELECTRONIC DEVICES, which is herein incorporated by reference. The frameworks, software configurations and characteristic curves may be represented by individual datafiles, contained as groups within a plurality of datafiles or all contained in a single datafile in the database 92.

The database 92 may also include a second portion of the software configuration for one or more of the IEDs 16. In this embodiment, the second portion of the software configuration may be transferred at the request of the corresponding IED 16. As previously discussed, the memory 22 (FIG. 1) of the IED 16 may include volatile and non-volatile portions. As such, the second portion of the software configuration may be transferred from the database 92 and stored in the volatile memory when the IED 16 is activated and the first portion of the software configuration stored in the non-volatile memory is executed. In operation this enables an IED 16 to have minimal amounts of software configurations stored in non-volatile memory. Upon initial startup of the IED 16, the remainder of the software configuration may be loaded into the volatile memory. For example, an IED 16 may have a minimum amount of software that includes a boot file stored in the non-volatile portion of memory by the manufacturer of the IED 16. The boot file may include instructions for the IED 16 to contact the manufacturer, retrieve and store the remainder of the software configuration in volatile memory and execute the entire software configuration to operate the IED 16.

The frameworks and software configurations stored in the database 92 may be associated with one or more of the IEDs 16 by one or more identifiers. The identifiers may identify, for example, frameworks or software configurations that may be used for a group of the IEDs 16, such as, for example, a particular model of the IEDs 16. Alternatively, the frameworks or software configurations may be associated with a particular IED 16. As such, each of the IEDs 16 previously installed in the field may have a copy of the currently operating software configuration stored in the database 92.

The database 92 may be accessed to perform changes, additions, upgrades, patches or any other type of modification to the copy of the existing software configuration operating in one or more of the IEDs 16. The database 92 may be accessed by the IED 16 and the browser 72 via the network 14 as will be hereinafter discussed. Access to the database 92 may allow the selection of one or more of the datafiles for a particular IED 16 or group of IEDs 16. The datafiles may be selected from the database 92 as a function of the identifier. Prior to allowing access to the database 92, the master server 86 may perform verification. Verification ensures that requester has the authority to access the datafiles being requested. The verification could be in the form of a password, entry of the identifier or any other technique for verifying authorization. Requests to access the database 92 may be made using the network server 88.

The network server 88 may be any CPU running applications for use within the network distribution system 70. In one embodiment, the network server 88 operates an application that forms an interface. The interface may be referred to as a virtual meter site. The virtual meter site provides an interface for a user to access and manipulate the software configuration of an IED 16 that is already operating in the field. In one embodiment, the IED 16, the browser 72 or the master server 86, may access the network server 88 using the network 14. It will be appreciated that there may be many alternative methods of accessing and manipulating the software configurations, both manual and automated, and all such methods are contemplated.

The virtual meter site operated by the network server 88 is preferably implemented as an Internet, intranet or extranet accessible site. The virtual meter site may be a secure site requiring customers to register or log in for access. Alternatively, the virtual meter site may be implemented as an electronic mail interface, as will be hereinafter discussed. Further, the virtual meter site may be implemented using telephony-based services such as automated telephone or operator assisted interfaces or facsimile based interfaces. A similar interface is disclosed in the above captioned U.S. Patent Application entitled SYSTEM AND METHOD FOR MANUFACTURING AND CONFIGURING INTELLIGENT ELECTRONIC DEVICES TO ORDER, which is herein incorporated by reference.

The network server 88 may provide functionality for a user of one or more IEDs 16 to access the database 92 using the virtual meter site. The datafiles within the database 92 may be displayed by the virtual meter site and modified by the user. In addition, the network server 88 may request the corresponding software configuration from the currently operating IED 16 that corresponds to the datafile being displayed. The network server 88 may perform verification that the software configuration in the datafile matches the software configuration currently operating in the IED 16. In an another embodiment, the master server 86 may perform the verification. Where the software configurations do not match, the user may be prompted to continue or end the modification session. If the user opts to continue, the user may have the opportunity to reconcile the differences by updating one or more of the datafiles. Where the software configurations do match, the user may perform modification of the datafile.

In one embodiment, modification of one or more selected datafiles may be performed at the direction of the user using display pages. The display pages may provide a selection list such as, for example, pull-down menus, pick lists or text entry fields to perform the modifications. All modifications may be performed on copies of the software configurations stored in the database 92. For example, a user wishing to change an alarm setpoint in a group of IEDs 16 may select the identifier for the group. That part of the software configuration common to the group would display on the virtual meter site. The user may then select the alarm setpoint and enter the new value. The new value may be stored in datafiles representing the software configuration for each of the IEDs 16 in the group.

In another embodiment, the network server 88 operates the virtual meter site using interactive pages capable of processing and applying a users request. In this embodiment, the network server 88 includes one or more configuration applications capable of analyzing the copy of the software configuration of one or more operating IEDs 16 based on the identifier. The configuration application performs an assessment, such as through an interactive hierarchical series of interrogatories presented via a display page, to determine the needs of the particular user. Once the needs are assessed, the configuration application adds the appropriate framework or modifies an existing framework to include additional functionality specified by the user.

The modifications and additions are performed on the copy of the datafile(s) containing the software configuration of one or more IEDs 16 already in operation in the field. For example, a user specifies a group of IEDs 16 and requests an upgrade in functionality to include detection and measurement of harmonics. The configuration application analyzes the software configurations of each of the IEDs 16 in the group and modifies the existing frameworks to implement the upgrade. Implementation among the IEDs 16 in the group may vary depending on the existing functionality of the IEDs 16. For example some of the IEDs 16 may need an additional framework, while others merely need modification of an existing framework.

In yet another embodiment, a modification to an existing software configuration may be selected from a selection list(s) of previously stored software configuration upgrades listed in the virtual meter site. The previously stored software configurations may be publicly available to any user or may be exclusive to a particular user or group of users. For example, where a user selects an identifier for a predetermined group of IEDs 16, a list would be available of previously stored software configurations for that identified group. The user may select a configuration and request an upgrade of the group.

Access to a software design tool is available over the network 14 in another embodiment. The software design tool may be accessed and utilized through the network server 88 to create and modify the frameworks during modification of a datafile. An exemplary software design tool is the ION™ Designer software design tool. As in the previous embodiments, modifications may be made to copies of the software configuration in the database 92.

Other procedures for modification of the functionality of the IEDs 16 are contemplated such as, for example, the ability for a user to select stored software configurations of one or more IEDs 16 and overwrite stored software configurations of one or more other IEDs 16. Another procedure may allow the manufacturer of the IEDs 16 to provide enhancement or repairs of the frameworks or firmware by modifications to the datafile of one or more of the IEDs 16.

The network server 88 may also maintain the financial accounting associated with modifications and upgrades to IEDs 16 previously installed in the field. Financial accounting may include, for example, providing pricing for various available upgrades, maintaining charge accounts for different users and providing methods of online payment. For example, where a user wishes to upgrade the software configuration of a group of IEDs 16 to include historical data logging, the network server 88 may determine the cost for the upgrade to each IED 16 and present a total price to the user. The IEDs 16, the network server 88, or a combination of both may supply pricing for the upgrade. Following selection of payment method and entry of billing information, the user may be allowed to, proceed with the transfer of the modification to the corresponding IEDs 16.

Methods of online payment may include, for example, pre-authorized payment structures that may further include user credit systems or authorized billing codes. Direct or pre-authorized payment plans may occur through an interface on the network server 88. Further, communication with other payment authorization services such as, for example, dial-up authorizations or other online credit-card networked servers may also be utilized to provide and authorize online payments. Exemplary well known payment authorization services include, for example, Visa™, MasterCard™, debit-cards, electronic payment cards or any other authentication systems for financial information. It may be appreciated that the actual billing authentication may take place independent of the browser 72 and network server 88. For example, the IED 16 may initiate contact with a server (not shown) performing payment authentication and, upon receipt of authentication, contact the network server 88 to transfer the billing data and the requested upgrade to the software configuration.

In the presently preferred embodiments, the master server 86 and the network server 88 may cooperatively operate to generate and transfer an update that includes the modifications. Alternatively, a server, or a plurality of servers performing some or all of the functions of the master server 86 and the network server 88 may generate and transfer an update. Following completion of the modifications to the datafile, the user may request the revised copy of the software configuration be stored in the database 92. Upon storage of the datafile, the master server 86 may be triggered to initiate the generation and transfer of the update. The network server 88 may be triggered to initiate the generation and transfer of the update by storage of the datafile. In addition, a command by the user, payment or any other user initiated triggering mechanism may initiate the generation and transfer of the update to the corresponding IEDs 16. In the previously discussed embodiments, the generation and transfer of an update to the software configuration of one or more IEDs 16 currently operating in the field is an automated process that may be initiated by activities of the user.

The master server 86, or the network server 88, may transfer updates that include the entire software configurations incorporating the modifications. Alternatively, the update may include only the modifications to the software configuration currently operating in the corresponding IEDs 16. Where the updates include only the modifications, a comparison of the modified datafile and the software configuration currently in operation in a corresponding IED 16 are compared to generate the update. The differences are packaged as the update and transferred to the corresponding IED 16.

In another embodiment the IED 16 may contain a software configuration that includes all, or a large part, of the functionality and features available for the IED 16. However, only functionality and features previously purchased by the user are currently operational in the IED 16. The remaining functionality and features may be disabled in the software configuration of the IED 16. A modification to the software configuration of this embodiment involves enabling those portions of the software configuration that correspond to the modification requested. Updates transferred to the IED 16 of this embodiment may be a software key, an enabling code or any other enabling mechanism or technique for activating disabled functionality within the IED 16. The use of this type of enabling mechanism is disclosed in the above captioned U.S. Patent Application entitled MULTI-FEATURED POWER METER WITH FEATURE KEY, which is herein incorporated by reference in its entirety.

In this embodiment, the user, when ordering modifications or features for an IED 16, may be given the option of enabling the feature instead of uploading and installing the feature as previously described. This allows the user the flexibility of having faster access to additionally functionality within the IED 16. Faster access may take place since an update to enable a feature may take considerable less time to implement than an update that includes the entire software configuration or modifications to the existing software configuration. For example, when the IED 16 is prompted to enable a feature that is disabled, the IED 16, after processing the billing data as previously discussed, contacts the network server 88 to receive an update. It can be appreciated that transferring an update that includes only an enabling mechanism may be much less time consuming than uploading an entire modification or software configuration.

In another embodiment the IED 16 includes the software configuration and the enabling mechanism. As such, the user may, once the billing data is processed, have access to the enabling mechanism to enable the features without requiring the transfer of an update as previously described. It can be appreciated that the enabling mechanism may be in the form of a code that is displayed for the user to re-enter through the user interface to enable the feature, or may operate "behind the scenes" and automatically enable the feature once the billing data has been authorized.

In the previously described embodiments, updates for the IED 16 may be transferred via the network 14. In one embodiment, the use of email is the mechanism for transferring the update to the IED 16. The identifier associated with the update may also be associated with the email address of the particular IED 16. The master server 86 or network server 88 of this embodiment is capable of sending an email that includes the update. Since the update is transferred via email, the firewall/gateway server 84 for the IED 16 may require no additional configuration to allow the message to be delivered to the IED 16. Upon receipt of the email message, the email server 82 may forward the message to the identified IED 16. The IED 16 may extract and apply the update to the software configuration currently operating in the IED 16. The IED 16 may then store the updated software configuration. Alternatively, the email may include an executable that the IED 16 executes to extract, apply and store the update.

In another embodiment, the email server 82 is the designated recipient of the update. In this embodiment, the email server 82 is a translation device. The translation device includes an application that may extract the update from the email message and download the update to the IED 16 via the first intranet 76. In addition, the email server 82 may format the update prior to download.

In another embodiment, the update may be supplied in a data file from the master server 86 or the network server 88. In this embodiment, the firewall/gateway server 84 may be configured to allow the data file to pass through to the first intranet 76. The data file containing the update may be transferred to a designated recipient device, such as, for example, the browser 72, the firewall/gateway server 84 or some other translation device in communication with the network 14. The translation device may be compatible with the IED 16 and contain an application that functions to communicate with, and download the update to the IED 16 via the network 14. In another embodiment, the IED 16 may include capability to obtain or be assigned an IP address. In this embodiment, the data file may be transferred directly to the IED 16. Upon receipt, the IED 16 may translate the data file to a compatible format, store and begin operating with the update.

In yet another embodiment, a combination of e-mail and datafiles may be used to initiate the transfer. For example, the IED 16 may be contacted by an e-mail from the master server 86 or the network server 88. The e-mail message may indicate that an update has been generated. Following receipt of the e-mail, the IED 16 may retrieve the update in the form of a datafile from the master server 86 or the network server 88.

Since an e-mail message is sent to the IED 16, and the IED 16 retrieves the datafile, the firewall/gateway server 84 may require no additional configuration.

Figure 6:
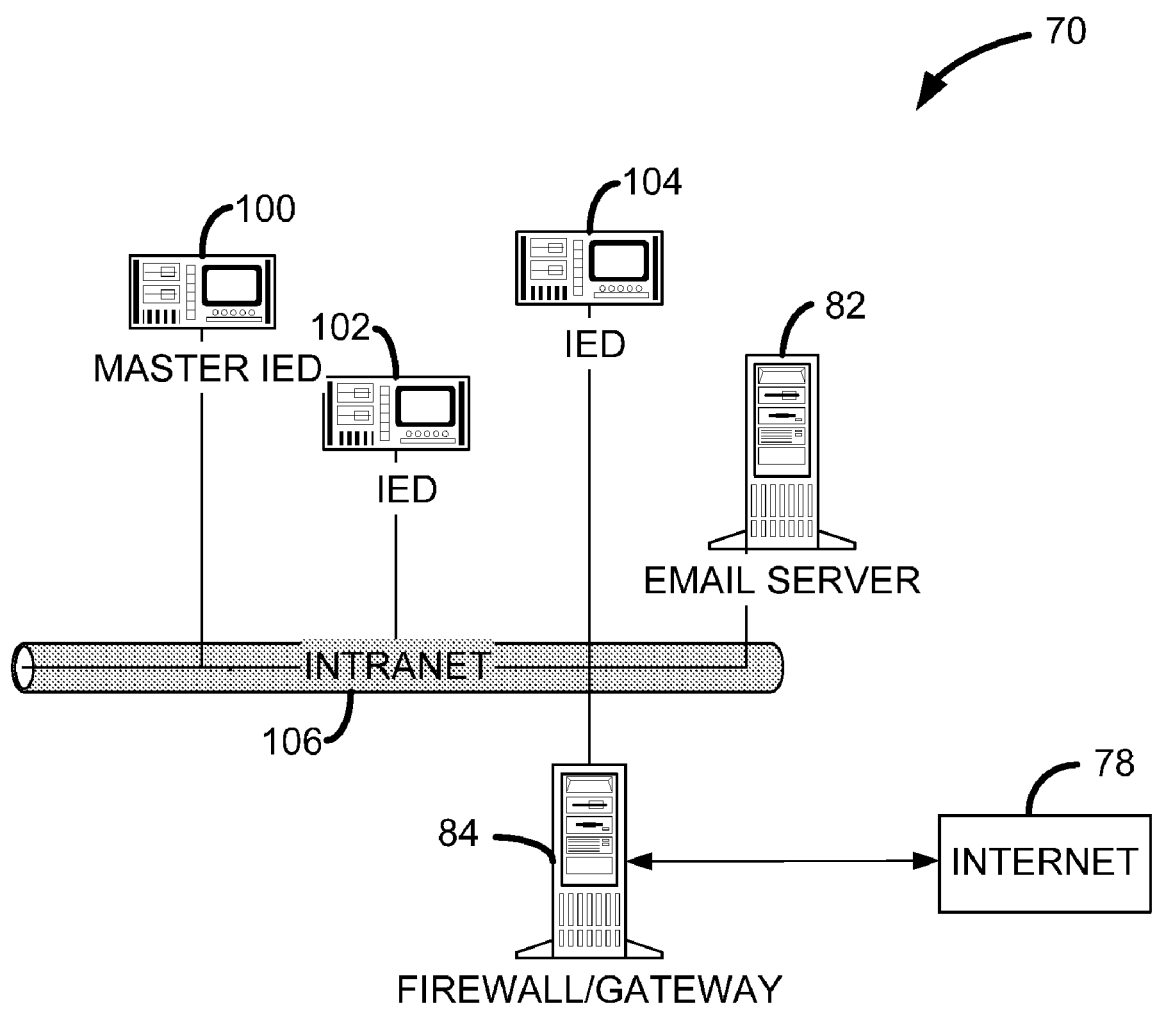
FIG. 6 is a block diagram of another embodiment of a portion of a network distribution system that includes the intelligent electronic device illustrated in FIG. 1.

FIG. 6 illustrates a portion of another embodiment of the network distribution system 70. The network distribution system 70 includes the email server 82, the firewall/gateway server 84, a master IED 100, a first IED 102 and a second IED 104 that operatively communicate over the Internet 78 and an intranet 106 as illustrated. In this embodiment, the master, first and second IEDs 100, 102, 104 may be physically located at the same location or may be dispersed among multiple locations.

The master IED 100 may be configured to communicate by email and/or data file transfer in the manner described by the previous embodiments. In addition, the master IED 100 may communicate with the first and second IED 102, 104 via the intranet 106. During operation, updates transferred to the master IED 100 include information identifying the final destination. The master IED 100 may use the information to route the updates to itself, the first IED 102 or the second IED 104. In addition, the master IED 100 may operate as a translation device to translate the update into a compatible format or otherwise "unpack" and reconfigure the update received. In this embodiment, the IEDs 100, 102, 104 may also communicate using peer-to-peer communications. One of the IEDs 100, 102, 104 may contain functionality that may be transferred to another one of the IEDs 100, 102, 104. For example, where the software configuration of the first IED 102 includes functionality not present in the second IED 104, the functionality may be transferred to the second IED 104. Similarly, an enabling mechanism present in the first IED 102 may be transferred to the second IED 104.

Referring now to FIGS. 1, 5 and 6, within the previously discussed embodiments, the IED 16, 100, 102, 104 may continuously monitor the electrical energy in the conductors 12 during the transfer and revision of the software configuration currently operating in the IED 16, 100, 102, 104. For purposes of the remainder of this discussion, the IED 16, 100, 102, 104 illustrated in FIGS. 1, 5 and 6 will hereinafter be referred to simply as IED 16 or IEDs 16 unless otherwise noted. During operation, the IED 16 may receive the update by one of the previously discussed techniques. The IED 16 may then create a new version of the software configuration as a function of the update while continuing to operate on the existing software configuration. When the new version of the software configuration is completed, the IED 16 may perform a "hot transfer" to instantaneously switch from the existing software configuration to the new version of the software configuration. As such, the IED 16 may continuously monitor the electrical energy. It should be recognized that data associated with derived parameters, or parameters subject to storage may be lost during the switch.

In another embodiment, one or more status messages may be supplied to the user during the transfer and revision of the software configuration currently operating in the IED 16. The status messages may provide ongoing status during the operation as well as indication that the upgrade was successful. In addition, upgrade or data transfer logging may occur within the IED 16, the master server 86 or the network server 88. The logging may allow the user to access a stored log of information regarding the status of update transfers and upgrades. For example, a user may specify a batch upgrade of several IED's 16. The upgrade status and error logging may be utilized to aid the user in confirming successful completion of, or errors within, the upgrade process in each of the IEDs 16.

In addition, the IED 16, the master server 86, or the network server 88 may allow for revision control. Revision control may include the capability to revert to the previously operating software configuration option. In addition, revision control may allow the user to manage, view and evaluate changes and discrepancies between new upgrades, existing configurations and previous configurations. The ability to revert to the previous software configuration may allow a user to view the previous configuration and switch the IED 16 to operation with the previous configuration if deemed necessary. Management of the changes and discrepancies may include identification of discrepancies, suggested fixes for the discrepancy as well as error identification within the software configuration.

Figure 7:
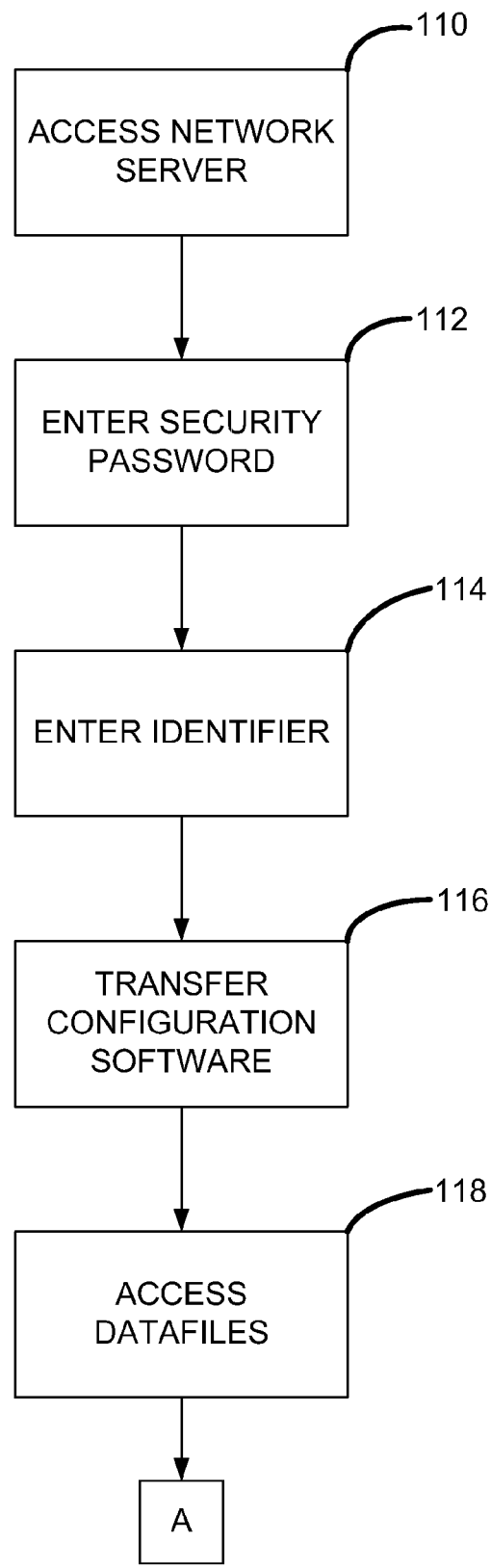
FIG. 7 is a first part of one embodiment of a flow diagram illustrating operation of the network distribution systems illustrated in FIGS. 5 and 6.

FIG. 7 is a flow diagram illustrating operation of one embodiment of the network distribution system 70. The operation will be described with reference to the devices identified in FIGS. 5 and 6. Operation begins with accessing the network server 88 via the network 14 at block 110. At block 112, a password or other security protection is entered to access the virtual meter site within the network server 88. The identifier for the IED 16 or group of IEDs 16 of interest is entered at block 114. At block 116, a copy of the software configuration currently in operation in the IED 16 or each of the IEDs 16 associated with the identifier is transferred to the network server 88. The datafiles from the database 92 are accessed by the network server 88 at block 118.

Figure 8:
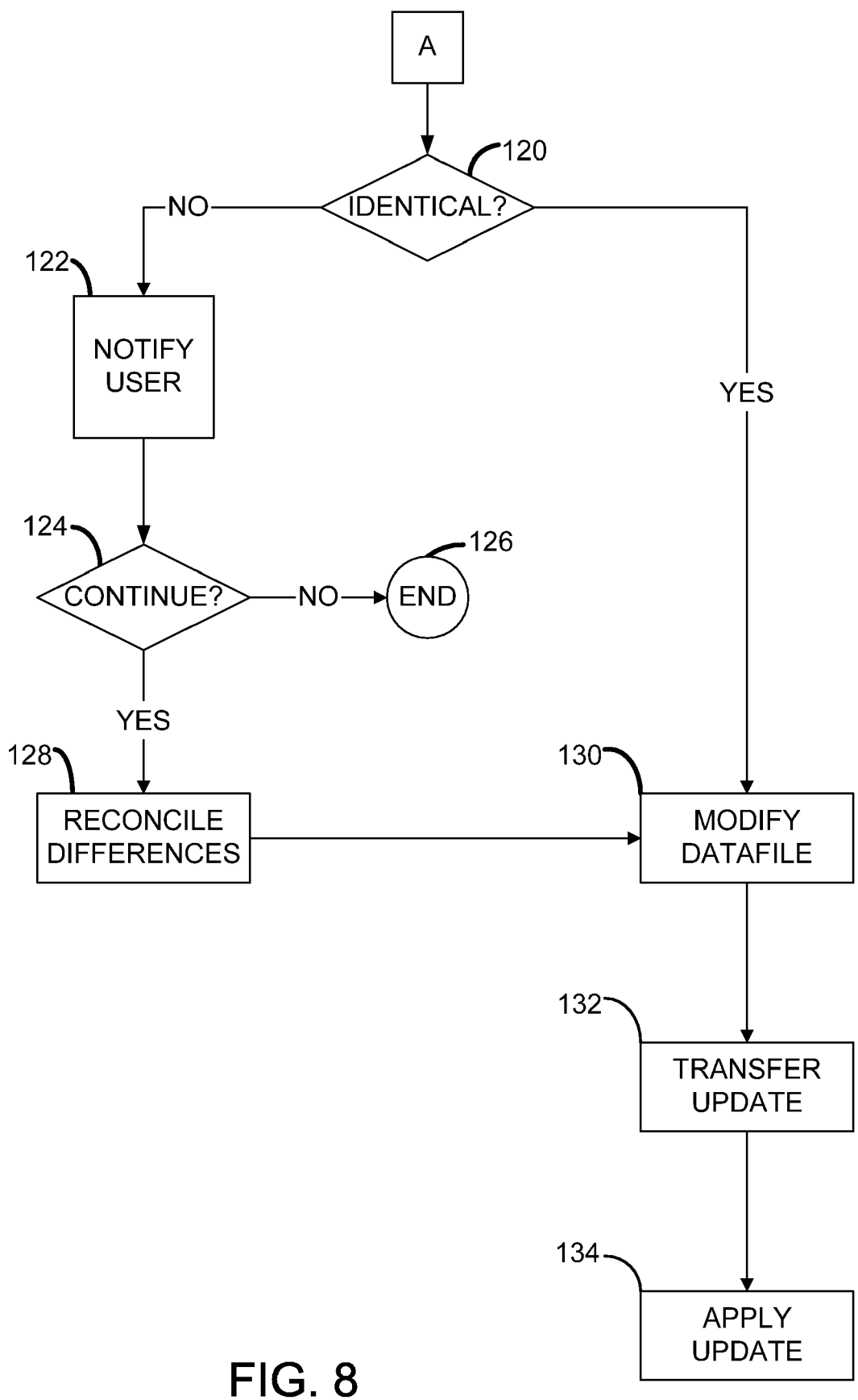
FIG. 8 is a second part of the flow diagram of FIG. 7.

Referring now to FIG. 8, at block 120, a comparison is made of the datafiles and the corresponding software configurations currently in operation to determine if they are identical. If the configurations are different, the user is notified at block 122 of differences. At block 124, the user is prompted to continue. If the user elects not to continue, the modification session ends at block 126. If the user elects to continue, reconciliation of the differences may be performed at block 128. At block 130, access to the datafiles is provided to allow modification. If the configurations were identical at block 120, access to the datafiles is provided to allow modification at block 130. At block 132, modifications are completed and storage and transfer of the update are initiated. The update is provided to a corresponding IED 16 at block 134. At block 136, the IED 16 applies the update and continues operation.

Referring again to FIGS. 5 and 6, in another embodiment, updates may be pulled from the master server 86 or the network server 88 by the IEDs 16. The IEDs 16 may be instructed to request updates on a predetermined schedule. In this embodiment, the IEDs 16 may be activated as a group, or individually, by the predetermined schedule to contact the master server 86 or the network server 88 and request any available updates. Upon receiving such a request, the data file may be compared to software configuration currently operating in the IED 16 as previously discussed. Where the datafile and the software configuration do not match, an update may be generated. The update may be retrieved by the IED 16, as a function of the identifier, in an automated fashion. Alternatively, the update may be generated and transferred by the master server 86 or the network server 88, as previously described. In an another embodiment, the IEDs 16 may be activated to check for updates by an email message, instruction from the browser 72 or manual requests entered through the user interface 18 (FIG. 1).

In another embodiment, the IED 16 may include security measures as part of the update process. In this embodiment, when the IED 16 is contacted to accept an update, the IED may notify a system administrator of the pending update. The system administrator may be the owner of the IED 16 or some other individual overseeing operation. The IED 16 may notify the system administrator by an email message, an alarm message, a pulse output, a pager message or any other form of notification. The IED 16 may require some form of approval by the system administrator prior to accepting the update. The update may be received by the IED 16 and held without implementation until approval by the system administrator. In another embodiment, the IED 16 may be disabled by the system administrator from accepting updates.

The IED 16 of another embodiment may initiate the modification of the datafiles in the database 92. Modifications to the software configuration of the IED 16 may be performed manually using the user interface 18 (FIG. 1). Following completion of the modifications, the IED 16 may be triggered to contact the master server 86 using the network 14. The IED 16 may be triggered by the act of storing the modified software configuration, a user entered command or any other technique for triggering the transfer. The update to the software configuration may then be packaged by the IED 16 and transferred to the master server 86. The master server 86 may receive and apply the update to a datafile as a function of the identifier associated with the IED 16.

In yet another embodiment, the IED 16 may be used to initiate an upgrade to the software configuration currently operating in that IED 16. The upgrade may be, for example, to add additional functionality to the IED 16. To initiate the upgrade, a user may communicate with the network server 88 using the user interface 18 (FIG. 1). The user may select the desired upgrade from, for example, a list residing within the IED 16, or by interacting with the network server 88 as in the previously discussed embodiments.

Once the user has selected an upgrade, the network server 88 may retrieve the currently operating software configuration and provide pricing data to the IED 16. The user may be prompted by the IED 16 to provide billing information that may be transferred to the network server 88 by the IED 16. Following authentication of the billing information, the master server 86 or the network server 88 may initiate the creation of an update and subsequent transfer to the IED 16 as previously discussed. In one embodiment, the IED 16 may be activated by the network server 88 to request the update as previously discussed. In another embodiment, the upgrade may already exist in a disabled state within the software configuration. The upgrade may be enabled by the master server 86 or the network server 88 by transfer of a software key or other similar enabling technique, as previously discussed. Following completion of the upgrade, the network server 88 performs the financial accounting to bill the user.

Figure 9:
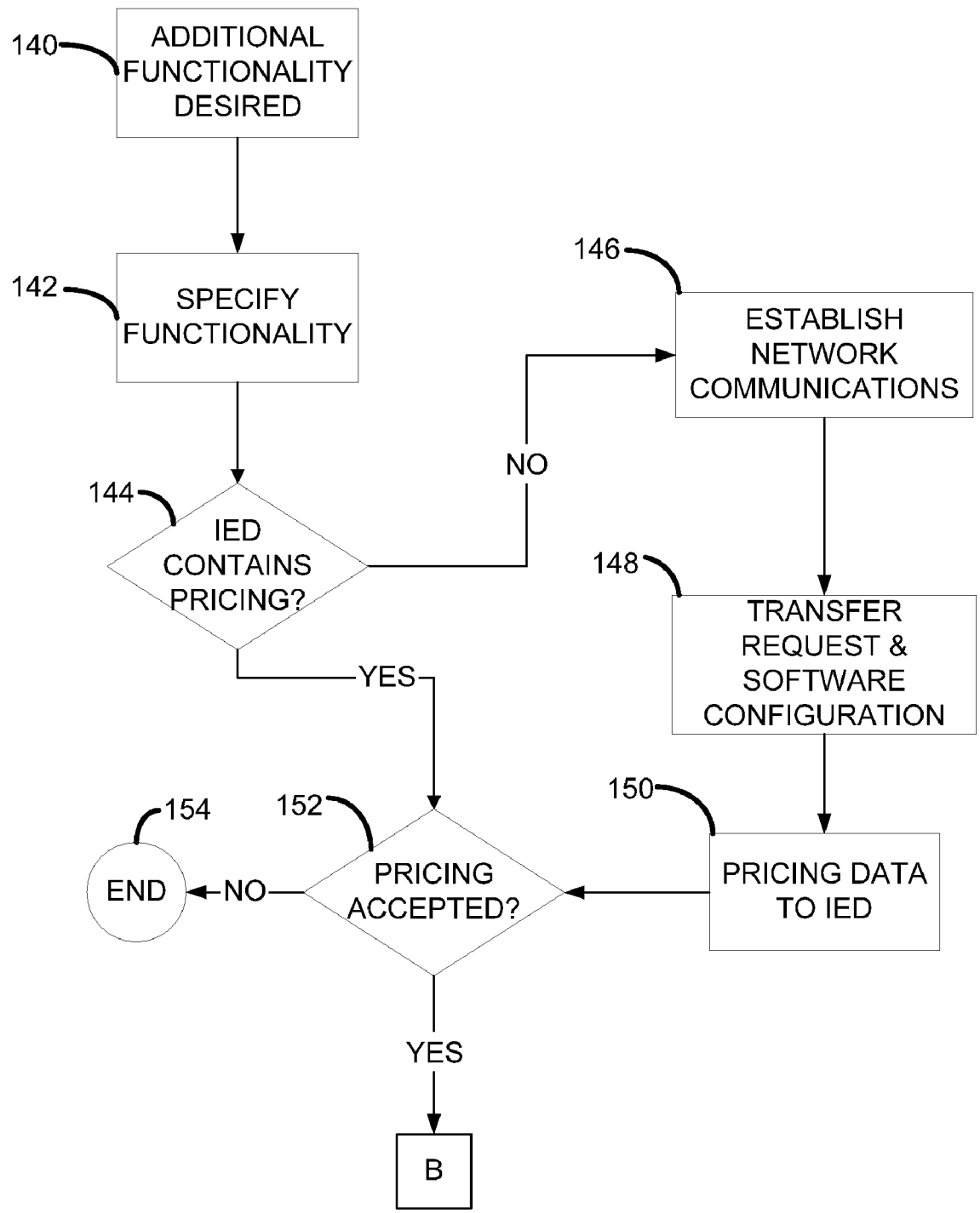
FIG. 9 is a first part of another embodiment of a flow diagram illustrating operation of the network distribution systems illustrated in FIGS. 5 and 6.

FIG. 9 is a flow diagram illustrating operation of the previously discussed embodiment where the user may upgrade a software configuration from the user interface 18 (FIG. 1) of a corresponding IED 16. The upgrade operation begins at block 140 where the user requires additional functionality within the IED 16. At block 142, a desired upgrade is specified. The IED 16 is checked to determine if the pricing is contained within the IED 16 at block 144.

If no pricing is found, the IED 16 may establish network communications with the network server 88 at block 146. At block 148, the upgrade request, a pricing request and the current software configuration operating in the IED 16 is transferred to the network server 88. The pricing data resulting from the request is transferred to the IED 16 at block 150. At block 152, the user is queried to accept the pricing on the upgrade. If it is determined at block 144 that the IED 16 contains pricing, the user is similarly queried to accept the pricing at block 152. If the user does not accept the pricing, the upgrade operation ends at block 154.

Figure 10:
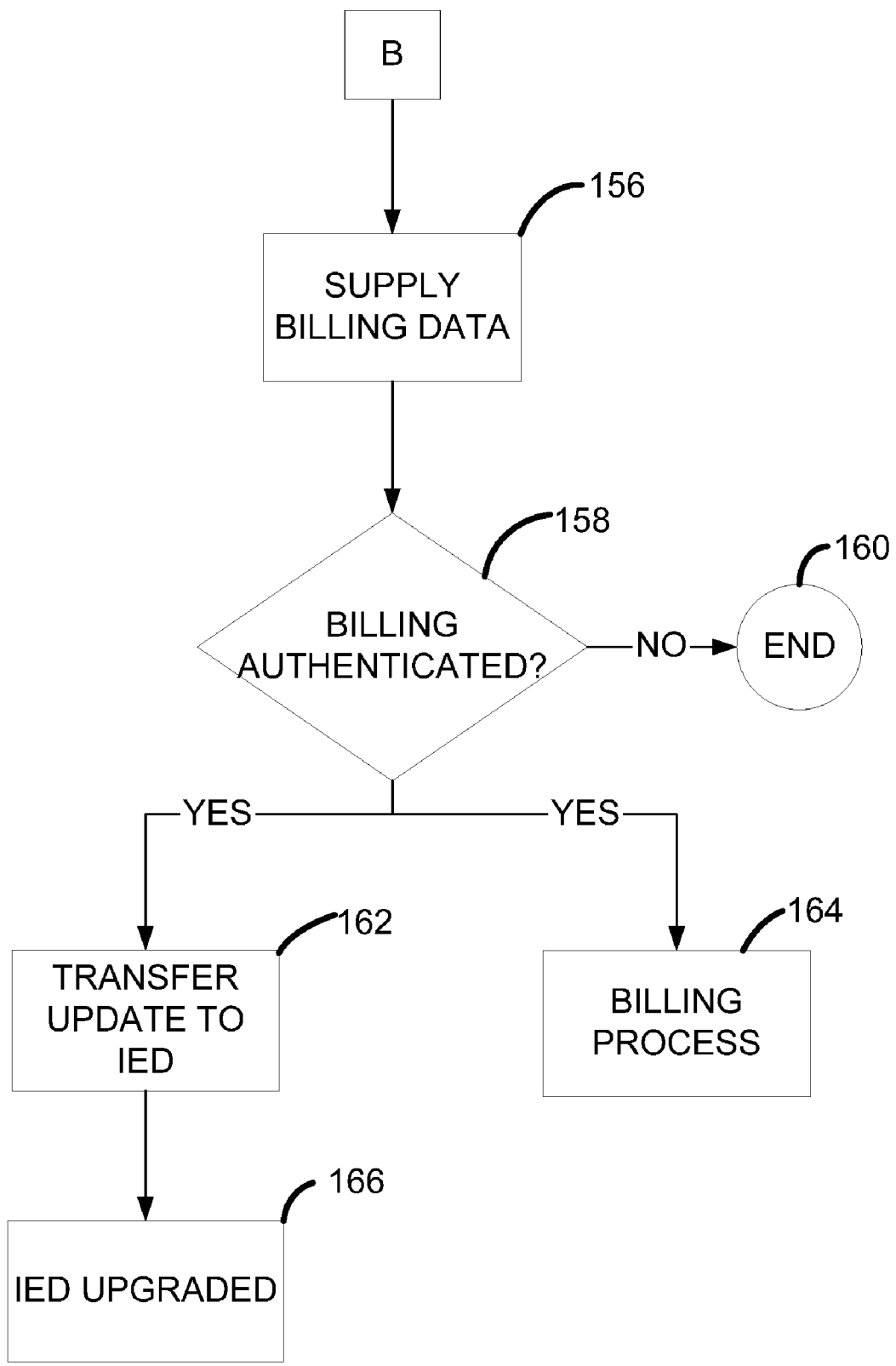
FIG. 10 is a second part of the flow diagram of FIG. 9.

Referring now to FIG. 10, if the user accepts the pricing at block 152, the user provides billing data that may be transferred to the network server 88, or some other payment authentication server as previously described at block 156. At block 158, authentication of the billing data occurs. If authentication fails, the upgrade operation ends at block 160. If the authentication is successful at block 158, the update may be transferred to the IED 16 at block 162. At the same time, the billing process is initiated at block 164. At block 166, the update is received, the IED 16 is upgraded and operation continues.

Figure 11:
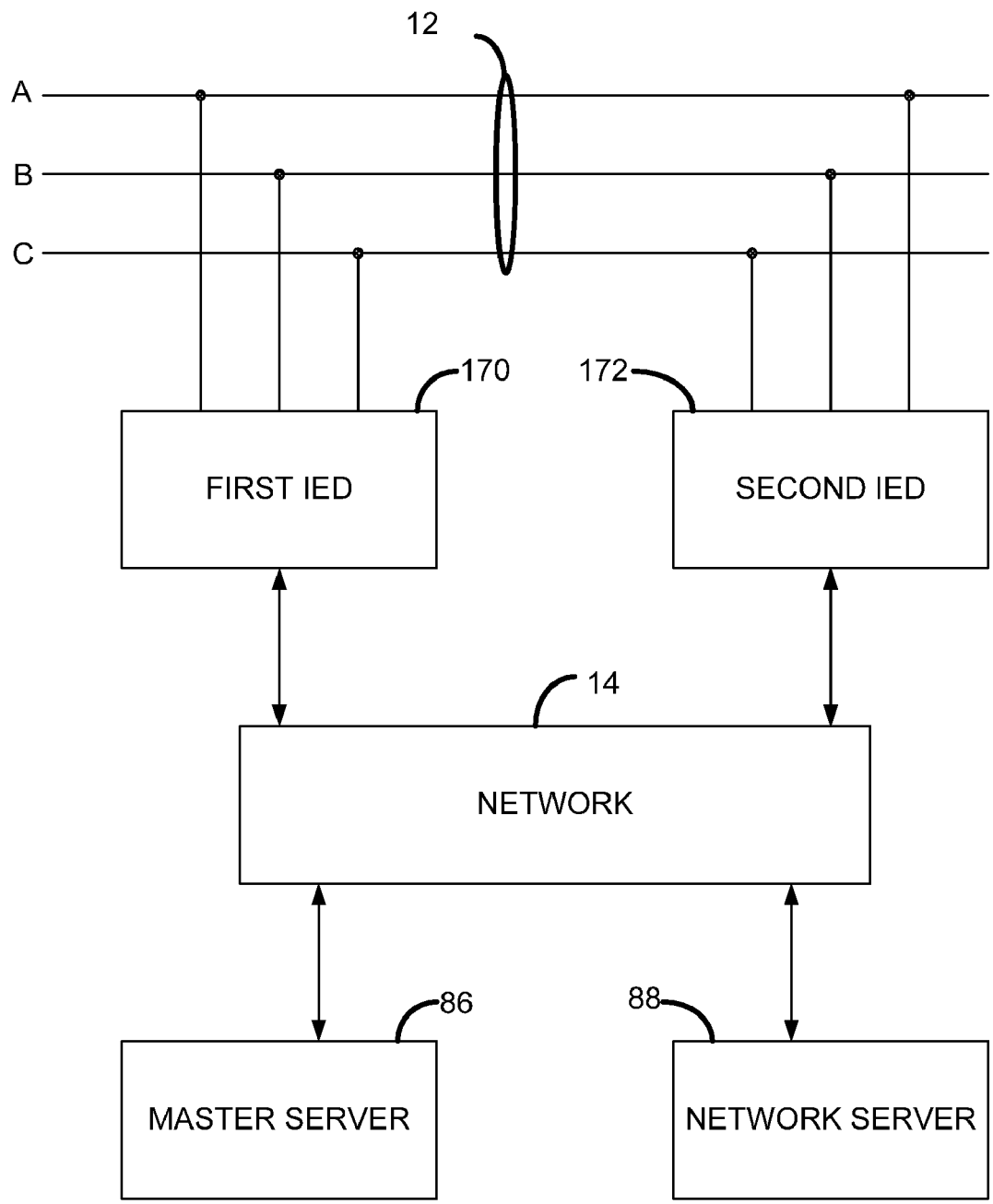
FIG. 11 is a block diagram of another embodiment of a portion of a power distribution system that includes embodiments of the intelligent electronic device.

FIG. 11 illustrates another embodiment of a portion of a power distribution system 10. The power distribution system 10 includes the conductors 12, the network 14, the master server 86, the network server 88, a first IED 170 and a second IED 172 connected as illustrated. The first and second IEDs 170, 172 are similar in operation and functionality to the previously discussed IED 16, 100, 102, 104 (FIGS. 1, 5 and 6). In addition, the conductors 12, the network 14, the master server 86 and the network server 88 maintain the same identifying numbers to illustrate similarity with the previous discussed embodiments of the same name and identifying number.

This embodiment involves maintenance, such as, for example, an upgrade or recalibration of the first IED 170, which is permanently installed and operating in the field. The second IED 172 may be installed on a temporary basis. The first IED 170 is required to be taken out of service to perform the upgrade or recalibration. To maintain continuous monitoring, the upgrade or recalibration may be performed using the master server 86 and/or the network server 88 and the network 14 in communication with the first and second IEDs 170, 172. It will be appreciated that the hardware and network components illustrated in FIG. 5 may be included as part of the operation of the network 14, the master server 86 and the network server 88. In this embodiment, the first IED 170 may be taken out of service for an extended period of time without lost data or the possibility of errors that are typically associated with this type of upgrade or recalibration. The presently preferred embodiments maintain the integrity and continuity of the data using the combination of the first IED 170 and the second IED 172 throughout the outage of the first IED 170.

Figure 12:
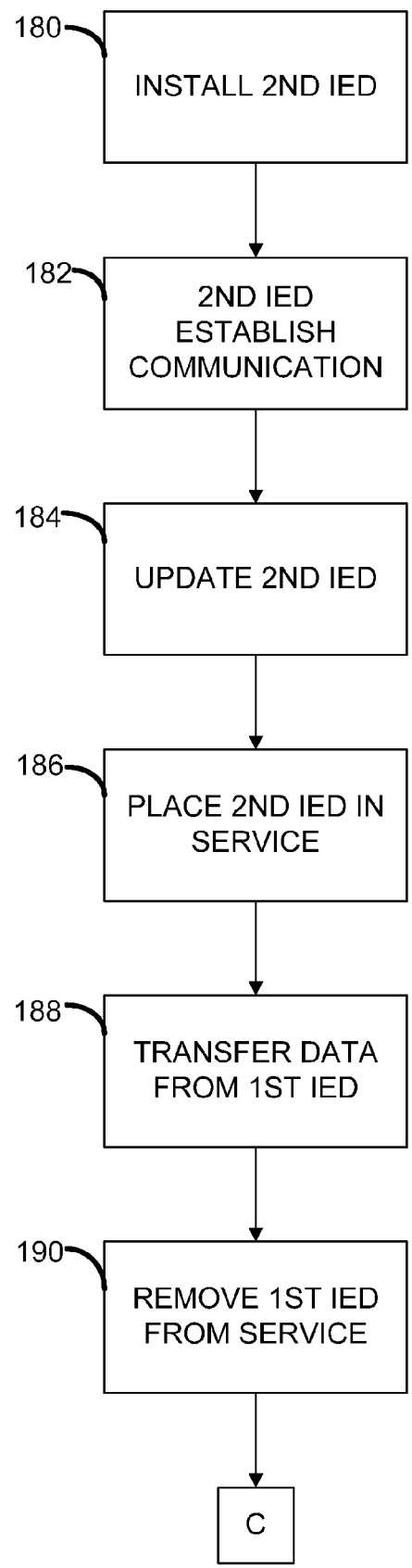
FIG. 12 is a first part of a flow diagram illustrating operation of the intelligent electronic devices illustrated in FIG. 11.

FIG. 12 is a flow diagram for the operation of the portion of the power distribution system illustrated in FIG. 10. The upgrade or reconfiguration begins at block 180 where the second IED 172 is installed by connection with the conductors 12 and the network 14. At block 182, the second IED 172 may establish communication with the master server 86 using the network 14. In addition, communication may include the network server 88. The data file that includes the software configuration of the first IED 170 is selected to generate an update for the software configuration of the second IED 172, at block 184. At block 186, the second IED 172 is placed in service with the same software configuration as the first IED 170 and begins collecting data. Prior to removing the first IED 170 from service, the data stored in the first IED 170 is transferred as a first data set to the master server 86 for storage using the network 14 at block 188. The transfer may also include use of the network server 88. The master server 86 stores the first data set as a function of the identifier associated with the first IED 170. At block 190, the first IED 170 is taken out of service for upgrade or recalibration.

Figure 13:
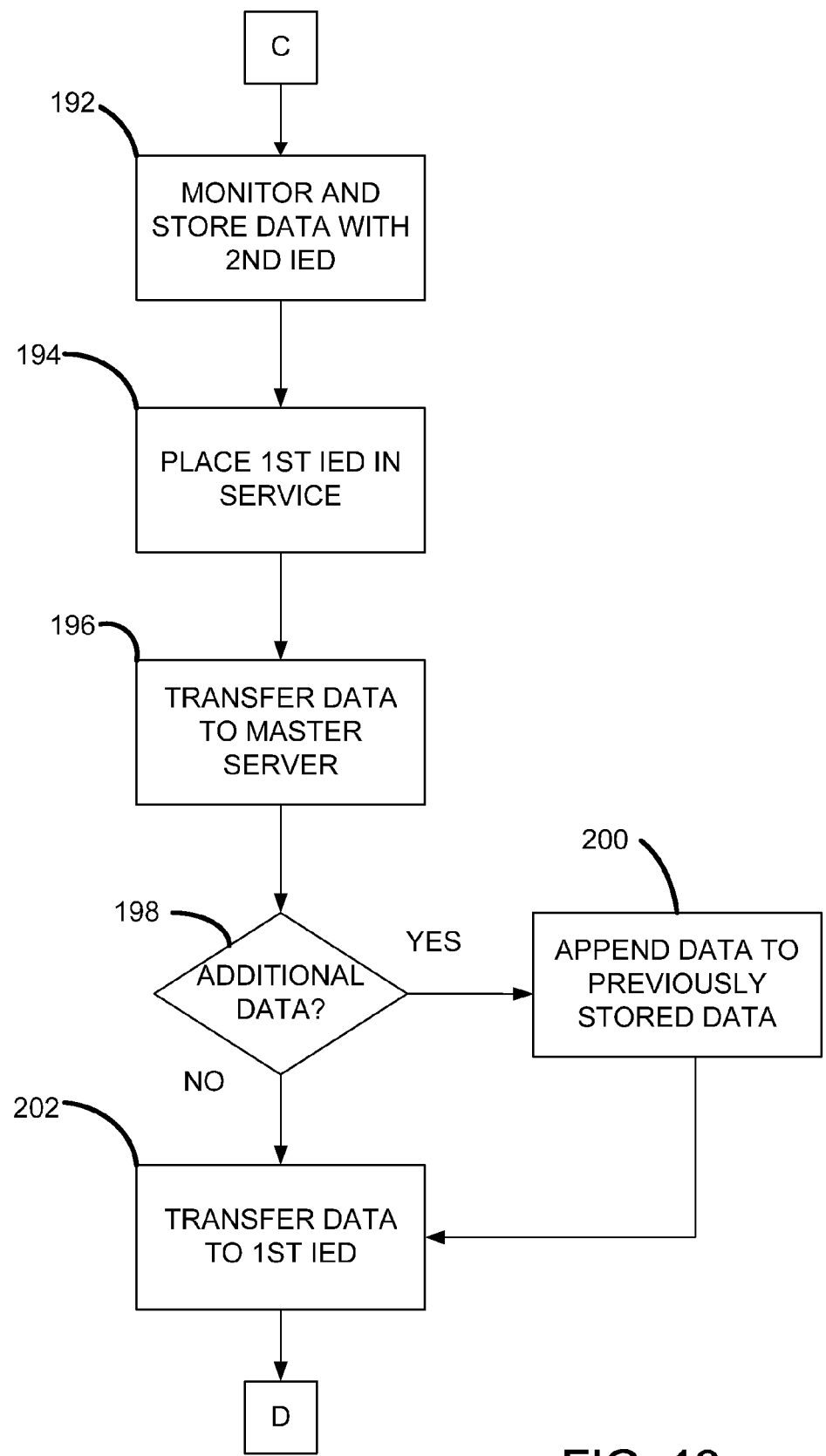
FIG. 13 is a second part of the flow diagram of FIG. 12.

Referring now to FIG. 13, the second IED 172 continues to monitor and store the electrical energy on the conductors 12 at block 192. The first IED 170 is placed back in service following completion of the maintenance at block 194. At block 196, the data collected by the second IED 172 is transferred to the master server 86 in the form of a second data set. The master server 86 checks the second data set to determine if data in addition to that from the previously stored first data set is present at block 198. If additional data is present, the additional data is appended to the data from the first IED 170 previously stored in the master server 86 at block 200. Alternatively, the master server 86 may maintain the first data set and the second data set separately. At block 202, the data stored in the master server 86 is transferred to the first IED 170. The transfer may be performed at the request of the first IED 170, by a user request made to the master server 86 and/or the network server 88 or any other previously discussed method to initiate the transfer. If at block 198, no additional data is transferred from the second IED 172, the data stored in master server 86 is transferred to the first IED 170 at block 202.

Figure 14:
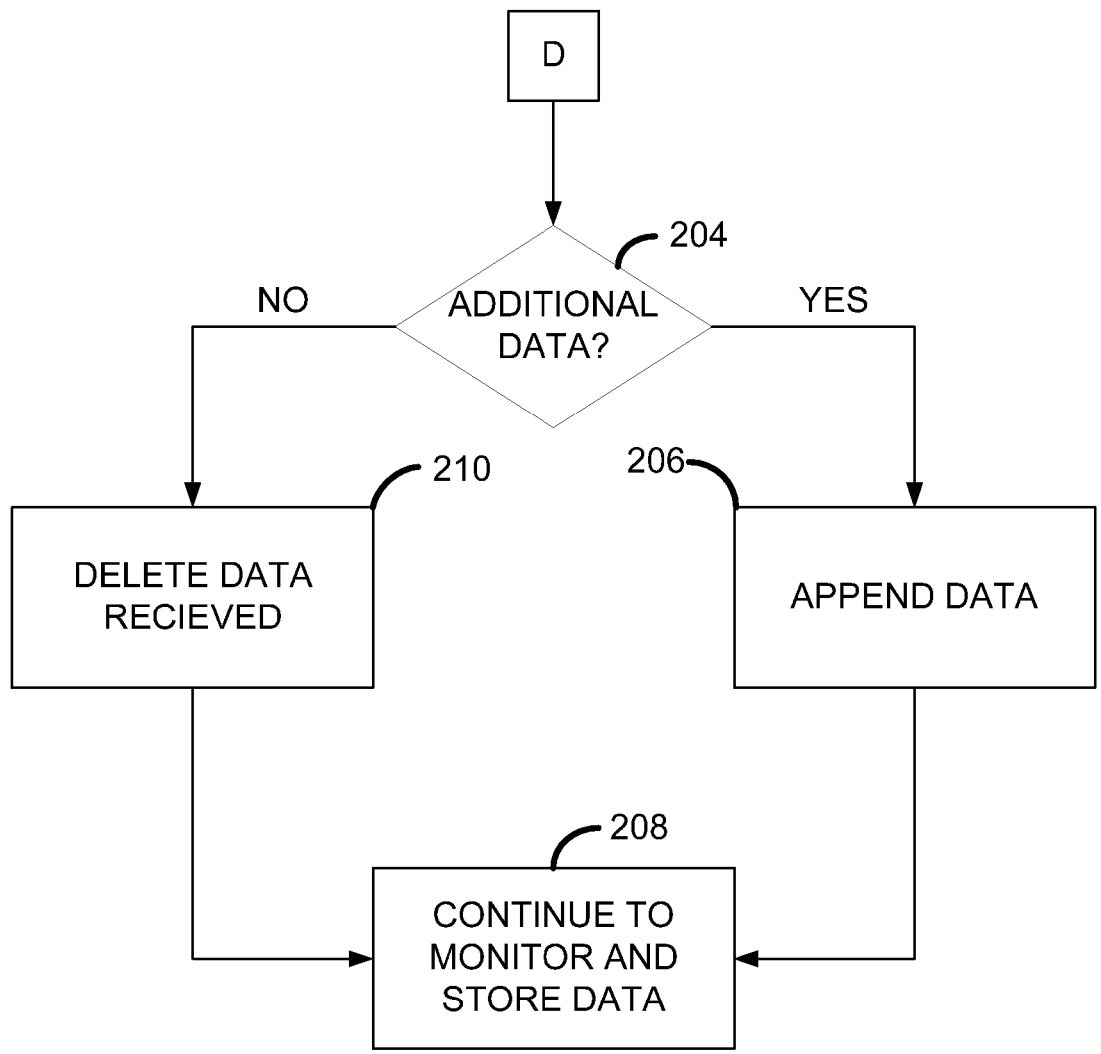
FIG. 14 is a third part of the flow diagram of FIG. 12.

Referring now to FIG. 14, the first IED 170, receives and analyze the data to determine if additional data to that currently stored in the first IED 170 exists at block 204. If additional data exists, the additional data is appended to the data stored in the first IED 170 at block 206. The additional data may be included in one combined data set from the database or may be the first data set and the second data set. At block 208, the first IED 170 continues to monitor and store data. If no additional data exists in the data received at block 204, the first IED 170 deletes the data received at block 210. At block 208, the first IED 170 continues to monitor and store data.

In another embodiment, the first IED 170 may be removed from service for maintenance and physically replaced by the second IED 172 on a temporary basis. In other words, the second IED 172 may be connected in place of the first IED 170. The data contained in the first IED 170 is transferred to the database 92 (FIG. 5) as a first data set prior to removal. The second IED 172 may installed in place of the first IED 170 and operated to save data in a similar fashion to the first IED 170 as previously discussed. The data collected by the second IED 172 may be transferred to the database 92 in a second data set prior to removal from service. The first IED 170 may be installed in place of the second IED 172 and returned to service following completion of the maintenance. The combination of the first data set and the data set may be transferred to the first IED 170 as in the previously discussed embodiments. In this embodiment, data would be lost for the period of time when the first and second IEDs 170, 172 are being connected and disconnected. However, the data collected by the first and second IEDs 170, 172 may be error free and readily accessible from the single location of the first IED 170.

In yet another embodiment, the database 92 may reside within the second IED 172. As such, the first IED 170 communicates with the second IED 172 via the network 14 to transfer data for storage in the database 92. In addition, the data from the second IED 172 may be stored in the database 92. Following completion of the maintenance, when the first IED 170 is returned to service, the data from the first and second IEDs 170, 172 may be transferred over the network from the second IED 172 to the first IED 170.

The previously discussed embodiments allow a user to track, retrieve and modify the software configuration of one or more IEDs 16 that are currently installed and operating. In addition, the update of the software configuration currently operating in one or more of the IEDs 16 may occur in an automated fashion. Transfer of the updates to one or more IEDs 16 may occur as a function of a request from the IED 16 itself, the user of the IED 16 or the manufacturer of the IED 16. Further, the versatility in monitoring with one or more of the IEDs 16 may be improved due to the relative ease of upgrading or modifying the functionality through changes to the software configuration during operation. Accordingly, the user of the IEDs 16 may maintain better control of the currently operating software configurations as well as easily and efficiently perform reconfiguration and upgrade.

Figure 15:
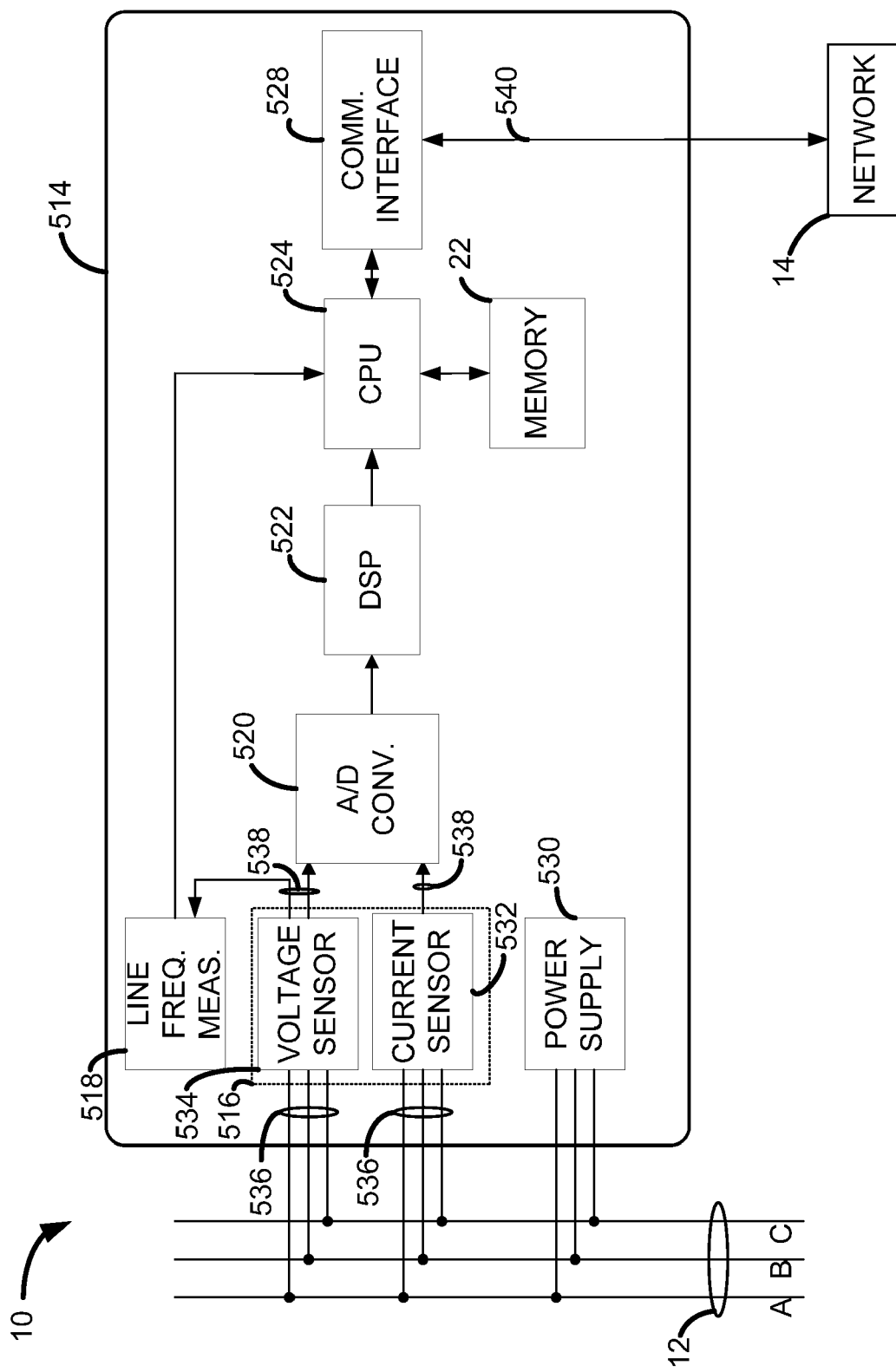
FIG. 15 is a block diagram of a portion of a power distribution system that includes an embodiment of an intelligent electronic device.

FIG. 15 illustrates a block diagram representation of an embodiment of a portion of a power distribution system 10. The power distribution system 10 includes a plurality of conductors 12 and an intelligent electronic device (IED) 514 (which may be the same or different from IED 14, described above). The conductors 12 are connected with the IED 514 as illustrated. As used herein, the term "connected" or "coupled" may mean electrically connected, optically coupled or any other form of coupling allowing the flow of data, electricity or some representation thereof between devices and components that are connected or coupled.

The conductors 12 may be, for example, electric transmission lines, electric distribution lines, power cables, bus duct or any other material capable of conducting electrical energy. The conductors 12 are operable to allow the flow of electrical energy therethrough. The conductors 12 are illustratively depicted in FIG. 15 in a three-phase circuit configuration; however the phase configuration is not limited to three-phases.

The IED 514 may be a programmable logic controller (PLC), a remote terminal unit (RTU), an electronic power meter, a protective relay, a fault recorder or other similar intelligent device capable of monitoring electrical energy. In addition, the IED 514 may perform other functions such as, for example, power distribution system protection, management of power generation, management of energy distribution and management of energy consumption. In one embodiment, the IED 514 includes a plurality of metering sensors 516, a line frequency measurement circuit 518, an analog-to-digital (A/D) converter circuit 520, a digital signal processing (DSP) circuit 522, a central processing unit (CPU) 524 (which may be the same or different from processor 20, described above), IED memory 22 and a communications circuit 528 connected as illustrated in FIG. 15.

In addition, the IED 514 includes a power supply 530 that is connected with the conductors 12. The power supply 530 may provide a source of power to energize the IED 514. In one embodiment, the power supply 530 uses the electrical energy flowing on the conductors 12 as an energy source. Alternatively, the power supply 530 may use other energy sources, such as, for example, an uninterruptible power source, batteries or some other source of power.

During operation of the power distribution system 10, the IED 514 monitors the electrical energy present in the conductors 12. The electrical energy is transformed by the metering sensors 516 and provided as an output to the IED 514. The output may be used by the IED 514 to derive, store and display various electrical parameters indicative of the electrical energy present in the conductors 12. The IED 514 may selectively apply a plurality of characteristic curves, as will be hereinafter described, to improve the accuracy of the electrical parameters derived from the output of the metering sensors 516.

The metering sensors 516 may be any device capable of sensing the electrical energy present in the conductors 12 and providing corresponding electrical signals. As illustrated in FIG. 15, the metering sensors 516 may be mounted within and forming a part of the IED 514. Alternatively, the metering sensors 516 may be separate devices mounted away from the IED 514, mounted on the IED 514, or a combination of both. The metering sensors 516 of the illustrated embodiment include a current sensor 532 and a voltage sensor 534. Although only one current sensor 532 and one voltage sensor 534 are illustrated in FIG. 15, any number of metering sensors 516 may be included in other embodiments.

The current sensor 532 may be, for example, a current transformer (CT) or other similar device capable of measuring current flowing in one or more of the conductors 12. Well known types of current sensors 532 include a wound type, a bar type, a bushing type, a window type, a clamp-on type, an optical type, a Rogowski coil type or a hall effect type. The current sensor 532 may include a primary winding 536 for measuring the primary current flowing in the conductors 12, and a secondary winding 538 for outputting a secondary current in direct proportion, and at a relationship, to the primary current.

The technique for measuring the current flowing in the conductors 12 varies with the type of the current sensor 532. The current sensor 532 may be connected in series with one or more of the conductors 12. In this configuration, the primary current flowing through the conductors 12 also flows through the current sensors 532. Alternatively, the current sensor 532 may include a window (not shown) positioned to surround a portion of one or more of the conductors 12. The window may be positioned such that the electromagnetic effect of the voltage and the current flowing through the conductors 12 induces a current and voltage output from the current sensor 532.

The current sensor 532 may step down, or transform, the primary current flowing in the conductors 12. The primary current may be transformed to a corresponding electrical signal that is compatible with the IED 514. The primary current may be transformed to a range of, for example, 1 to 5 amperes by the current sensor 532. The current sensor 532 may also operate to isolate the IED 514 from the voltage present on the conductors 12.

The voltage sensor 534 may be any device capable of measuring the voltage present on the conductors 12. One example of the voltage sensor 534 is a potential transformer (PT) that may be, for example, a multiple winding step-up or step-down transformer. In one embodiment, the voltage sensor 534 may be a single-phase device connected in parallel with one of the conductors 12. The primary voltage on the conductors 12 may be measured by a primary winding 536. A secondary voltage representing a stepped down version of the primary voltage may be an output from a secondary winding 538. During operation, voltage present on the conductors 12 is transformed, by the voltage sensor 534, to an electrical signal compatible with the IED 514. The secondary voltage may be, for example, a voltage in a range around 120 VAC.

In one embodiment, the metering sensors 516 transform the voltage or current received at the primary winding 536 based on a ratio. The ratio provides a relationship between the voltage or current present on the conductors 12 and the corresponding output of the metering sensors 516. The metering sensors 516 may be manufactured with a single ratio, or multiple ratios that may be selected by, for example, taps located on the metering sensors 516.

The metering sensors 516 may also include an identifier. The identifier may uniquely identify each of the metering sensors 516. Alternatively, the identifier may uniquely identify a predetermined group of metering sensors 516. The identifier may, for example, be an identification number, such as, a serial number or a part number. Alternatively, the identifier may be letters, numbers or a combination of both. The identifier may be designated by the manufacturer of the metering sensors 516 or may be designated as a result of development of characteristic curves as will be hereinafter described.

During operation, the metering sensors 516 sense the electrical energy on the conductors 12 and output a corresponding electrical signal. In one embodiment, the electrical signal is an analog signal that is received by the A/D converter circuit 520. In another embodiment, the metering sensors 516 may provide an output in the form of a digital signal and the A/D converter circuit 520 may not be required.

The A/D converter circuit 520 may be any circuit operable to convert analog signals to corresponding digital signals. During operation, the A/D converter circuit 520 receives the output from the metering sensors 516. The output may be received by the A/D converter circuit 520 in the form of analog signals and may be converted to digital signals by any of a number of well-known techniques. In one embodiment, the A/D converter circuit 520 may also perform amplification and conditioning during conversion. The resulting digital signals may then be passed to the DSP circuit 522.

The DSP circuit 522 may be any circuit that performs signal processing and enhancement. The DSP circuit 522 may be used in conjunction with the A/D converter circuit 520 in a well-known manner to enhance the quality of the digital signals. Enhancement may include, for example, noise removal, dynamic range and frequency response modification or any other technique for enhancing digital signals. Following processing by the DSP circuit 522, the digital signals are provided to the CPU 524.

As further illustrated in FIG. 15, the line frequency measurement circuit 518 may also receive the output from the secondary winding 538 of the voltage sensor 534. The line frequency measurement circuit 518 may be any circuit that performs frequency measurement of the output provided by the voltage sensor 534. During operation, the line frequency measurement circuit 518 receives the output from the voltage sensor 534. The output may be used to determine the frequency of the primary voltage using well-known frequency measurement techniques. The frequency, along with any other frequency related information, may be converted to digital signals by the line frequency measurement circuit 518 and provided to the CPU 524. Alternatively, the line frequency measurement circuit 518 may provide analog signals to the CPU 524.

The CPU 524 may be a microprocessor, a control unit or any other device capable of processing instruction sets. The CPU 524 may receive and process electrical signals representative of the electrical energy flowing on the conductors 12 to derive the electrical parameters. In the illustrated embodiment, the CPU 524 may process the digital signals provided by the line frequency measurement circuit 518 and the DSP circuit 522. The digital signals may be used to derive, for example, the voltage, current, watts, vars, volt amps, power factor, frequency and any other electrical parameters related to the electrical energy present on the conductors 12. In addition, electrical parameters relating to energy consumption such as, for example, kilowatt hours, kilovar hours, kilovolt amp hours and other time-based electrical parameters relating to the electrical energy may be calculated by the CPU 524.

The CPU 524 may also utilize characteristic curves corresponding to each of the metering sensors 516. The characteristic curves represent error correction to improve the overall accuracy of the IED 514. The characteristic curves may be applied by the CPU 524 to the electrical parameters measured and/or derived by the IED 514. The electrical parameters may be adjusted as a function of the characteristic curves to improve accuracy in the operating characteristics of a particular metering sensor 516. In addition, the characteristic curves may compensate for any other inaccuracies, such as, for example, those introduced by processing within the IED 514.

The characteristic curves may be stored in the IED memory 22 that is connected with the CPU 524.

The IED memory 22 of one embodiment may be a non-volatile memory, such as for example a flash memory device or other similar memory storage device in communication with the CPU 524. In another embodiment, the IED memory 22 may include both non-volatile memory and volatile memory. In this embodiment, the volatile memory may store the characteristic curves and the non-volatile memory may store operational code used for operation of the IED 514. The operational code may include instructions to retrieve and store the characteristic curves in the volatile memory when the IED 514 is energized. Retrieval of the characteristic curves may be performed by the IED 514 as will be hereinafter discussed.

The characteristic curves may be stored in the form of, for example, a table, a representative mathematical formula or any other method of representing error correction as a function of the operating range of one of the electrical parameters. A table may be used by the IED 514 to determine points along the characteristic curve based on interpolation or other similar methods of extrapolation. Mathematical formulas representative of the characteristic curves may be empirically derived based on curve fitting of experimental data. For example, one characteristic curve may be determined to fit:

$$\phi = aI^b + c \qquad \text{Equation 1}$$

where $\phi$ may represent the phase error of the sensor, I may represent the current and a, b and c may represent constants that define the characteristics of the characteristic curve. Another exemplary equation for representing a characteristic curve is given by:

$$\phi = ae^{bI} + ce^{dI} \qquad \text{Equation 2}$$

where d may represent another constant. Other equations and corresponding constants may be empirically derived for inaccuracy resulting from for example, ratio error, temperature, harmonics, noise and any other varying characteristic that may affect the accuracy of the IED 514.

Calculations to determine the constants may be performed by a number of techniques. In one technique, a number of test points may be plotted graphically to develop the characteristic curves. The quantity of test points plotted may be a function of the amount of non-linear variation in the characteristic curve. The resulting constants may then be manually entered into the IED 514 or electronically transferred to the IED 514 as will be hereinafter discussed. In another embodiment, the IED 514 may compute and store the constants during development of the characteristic curves.

Figure 16:
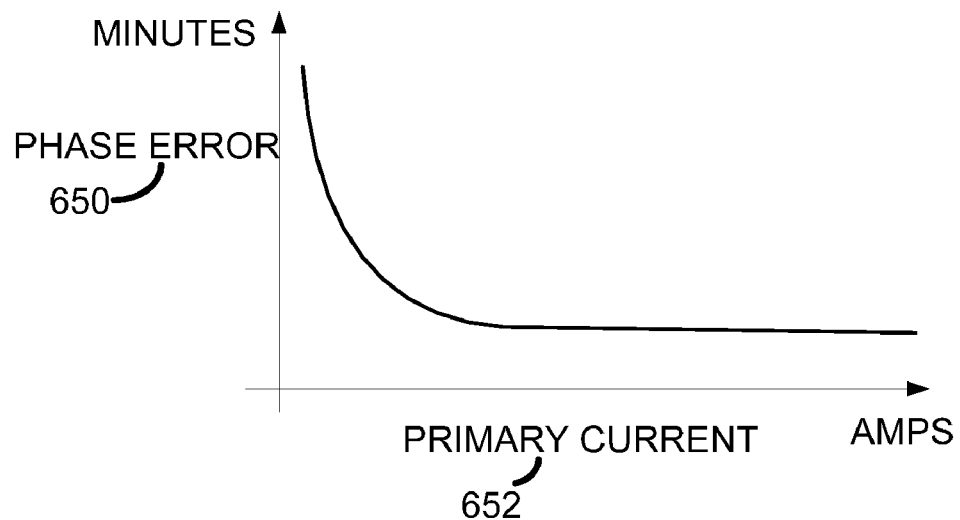
FIG. 16 is a graph illustrating one example of a characteristic curve for a current sensor.
Figure 17:
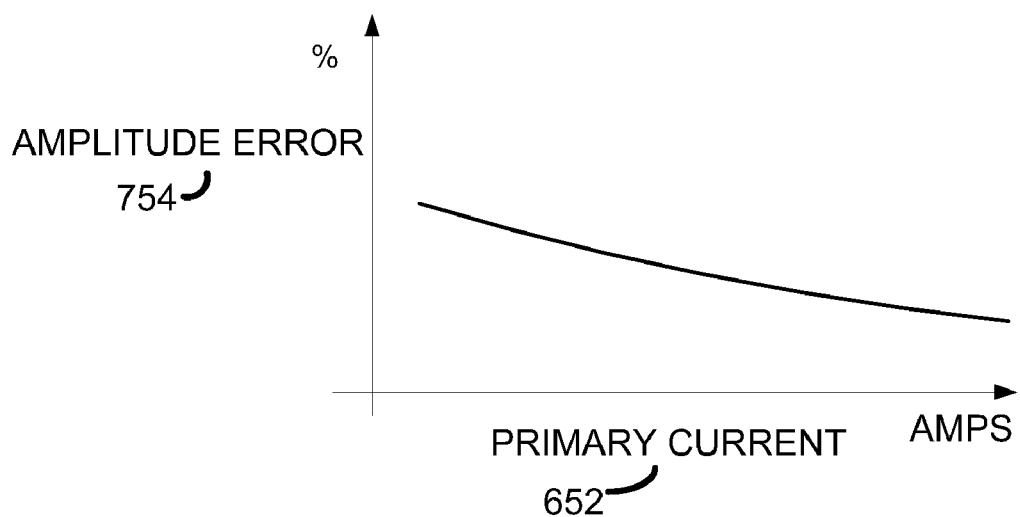
FIG. 17 is a graph illustrating another example of a characteristic curve for a current sensor.
Figure 18:
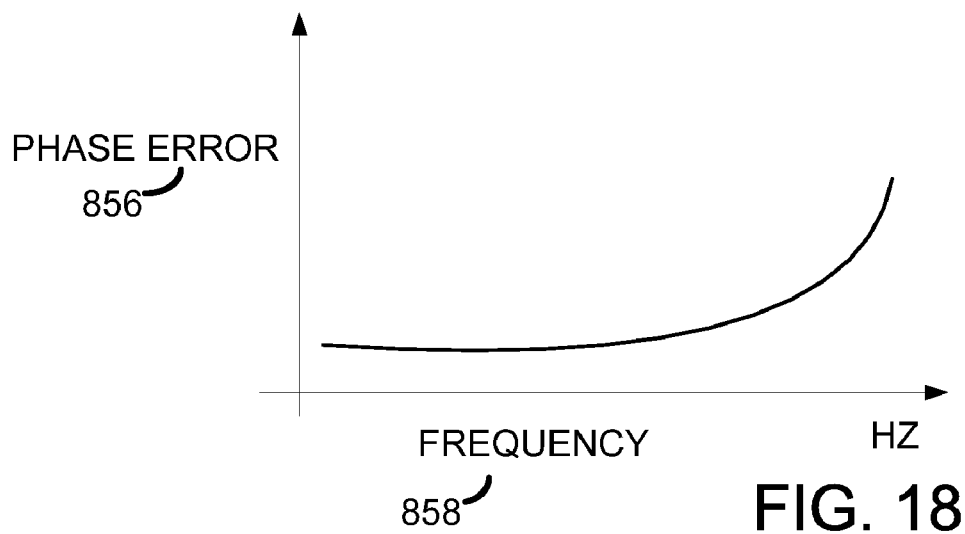
FIG. 18 is a graph illustrating yet another example of a characteristic curve for a current sensor.

FIGS. 16, 17 and 18 are some examples of characteristic curves that may be generated for a particular current sensor 532 (FIG. 15). FIG. 16 represents, for a particular burden and frequency, a phase error 650 for a range of primary current 652. The phase error 650 is also referred to as phase angle and may represent the difference between the phase of the primary current 652 and the phase of a secondary current (not shown). The phase error 650 may be used to adjust the phase of the secondary current during operation of the IED 514 based on the magnitude of the primary current 652.

Similarly, FIG. 17 represents, for a predetermined burden and frequency, an amplitude error 754 for a range of the primary current 652. The amplitude error 754, may also be referred to as a ratio error and represents the error in the transformation ratio when the primary current 652 is transformed to a secondary current (not shown). FIG. 18 illustrates, for a predetermined burden and primary current, a phase error 856 for a range of frequency 858. The phase error 856 represents the difference between the phase of a secondary current (not shown) and the phase of a primary current (not shown in FIG. 18) as the frequency 858 is varied.

Figure 19:
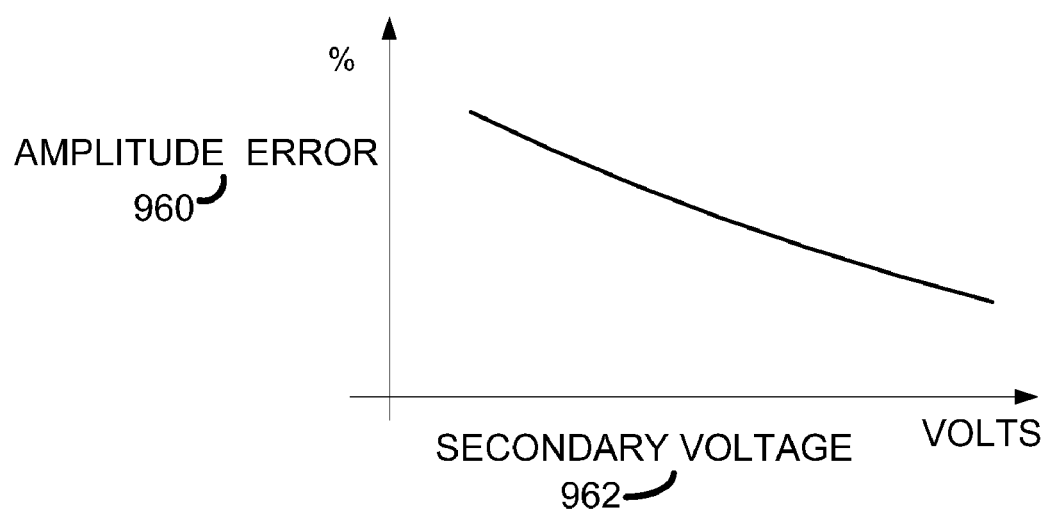
FIG. 19 is a graph illustrating one example of a characteristic curve for a voltage sensor.

FIG. 19 is an exemplary illustration of a characteristic curve for the voltage sensor 534 (FIG. 15). FIG. 19 depicts an amplitude error 960 for a range of secondary voltage 962. The amplitude error 960 represents the transformation error as the primary voltage (not shown) is transformed to the secondary voltage 962. During operation, the IED 514 may apply the amplitude error 960 to the secondary voltage 962. The illustrative examples of characteristic curves in FIGS. 16, 17, 18 and 19 are but a few of the many ways to identify the operational characteristics of a particular metering sensor under various operating conditions and should not be construed as a limitation on the present invention.

Referring again to FIG. 15, one or more characteristic curves may be determined through individual testing of each one of the metering sensors 516. Testing of the metering sensors 516 to generate the characteristic curves is accomplished by simulating operating conditions with a sensor-metering tester (not shown). The sensor-metering tester may be any device capable of simulating operation of the conductors 12 and the IED 514.

The sensor-metering tester may generate electrical energy and provide control of the associated energy parameters to simulate operation of the conductors 12. In addition, the sensor-metering tester may perform derivation of the electrical parameters as a function of the output of the metering sensors 516. During simulation of operating conditions with a particular one of the metering sensors 516, the electrical energy is supplied to the primary winding 536. In addition, a burden supplied by the sensor-metering tester is connected with the secondary winding 538. The burden may be determined based on the resistance and inductance of the electrical interface between the IED 514 and the particular one of the metering sensors 516. In addition, the internal impedance of a particular IED 514 designated for installation and operation with the metering sensors 516 may be used to determine the burden. Alternatively, the actual electrical interface and the particular IED 514 may be connected with the secondary winding 538 to provide the burden.

During testing, the frequency, voltage and current of the electrical energy may be varied and the electrical parameters may be derived by the IED 514. Alternatively, the sensor-metering tester may derive the electrical parameters in a fashion similar to the IED 514. Where the derived values of the electrical parameters deviate from expected values, characteristic curves may be developed. Characteristic curves may also be generated for deviations in the derived electrical parameters caused by varying characteristics in other operating parameters. Examples of varying characteristics include, for example, operating temperatures, changes in the ratio of the metering sensors 516, harmonics, noise or any varying characteristics affecting the accuracy of operation of the IED 514. In addition, characteristic curves may be generated for non-varying characteristics such as, for example, materials of manufacture of the metering sensors 516, window position or any other parameter that may affect accuracy. Accordingly, improved accuracy of the IED 514 may be achieved during any operating scenario by determining the appropriate characteristic curves through testing.

In another embodiment, characteristic curves may be determined through testing of a predetermined group of metering sensors (not shown). The predetermined group may be a classification of the metering sensors 516 based on the type of metering sensor, manufacturer model number, manufacturing lot, production run, repeatable test results or any other basis for grouping a plurality of the metering sensors 516 exhibiting similar operating characteristics. In this embodiment, testing may be performed on a plurality of the metering sensors 516 to develop average characteristic curves. The average characteristic curves may be applied to any one of the metering sensors 516 in the predetermined group to improve accuracy of operation.

A number of predetermined groups may be stored in the IED 514. In addition, a selection menu may be stored in the IED 514. The IED 514 may be configured using the selection menu to select the predetermined group in which the metering sensors 516 that are connected with the IED 514 are located. Accordingly, this embodiment provides improved accuracy of the IED 514 without the necessity of individual testing of the metering sensors 516.

Referring again to FIG. 15, during operation of the presently preferred embodiments of the IED 514, the CPU 524 receives and processes the digital signals from the DSP circuit 522. The CPU 524 may apply the characteristic curves during processing of the digital signals to generate electrical parameters representing the electrical energy present on the conductors 12. By application of the characteristic curves, the CPU 524 is capable of improving the accuracy of the electrical parameters derived from the output of the metering sensors 516.

Figure 20:
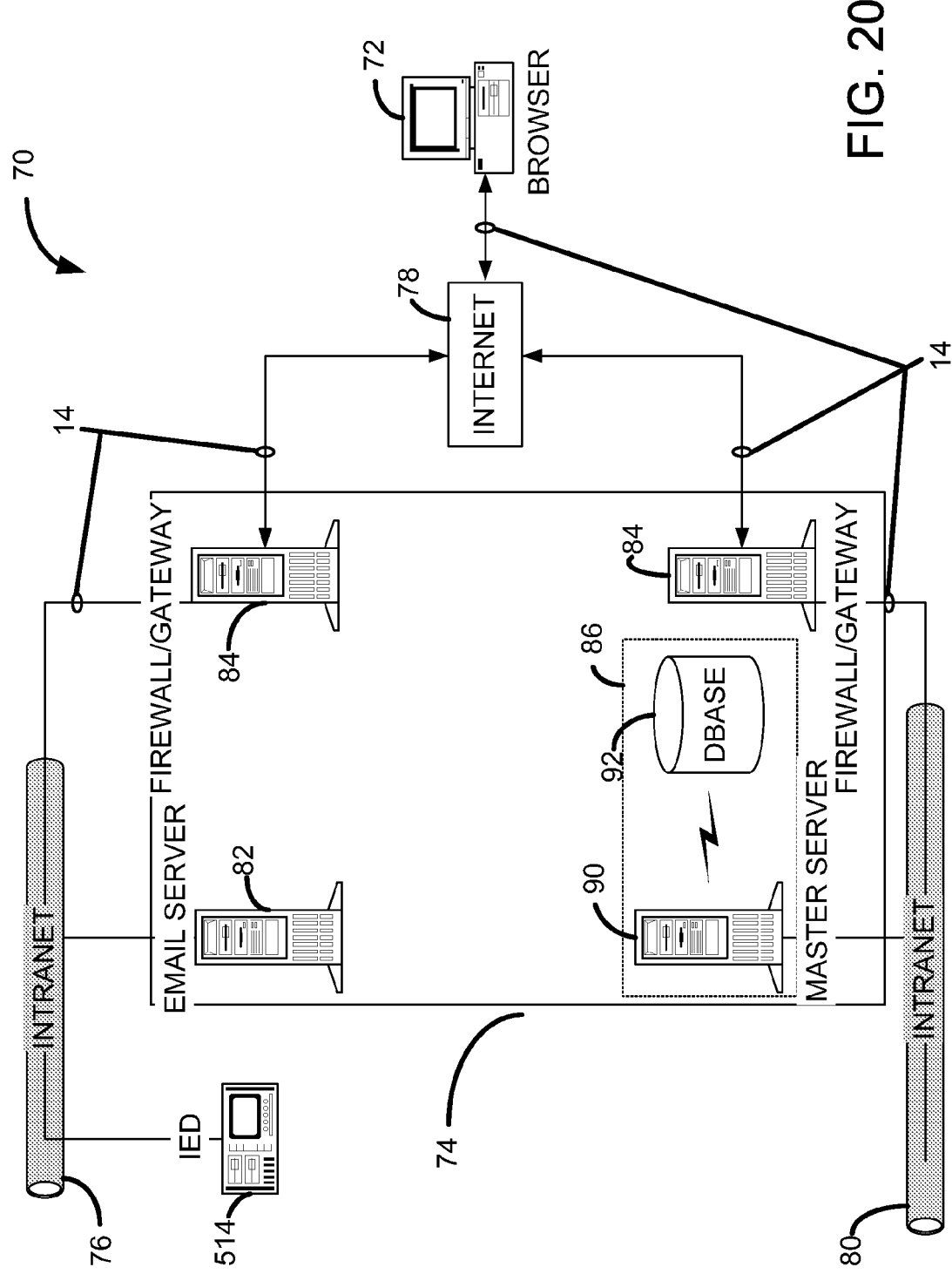
FIG. 20 is a block diagram of an embodiment of a portion of a network distribution system that includes the intelligent electronic device illustrated in FIG. 15.

In another embodiment, the IED 514 may dynamically select characteristic curves during operation as a function of operating conditions. The operating conditions may be any condition within the power distribution system 10 that may introduce error into the electrical parameters derived by the IED 514. Operating conditions may include temperature, voltage, current, frequency, harmonics, noise or any other varying operating condition affecting measurement by the metering sensors 516 and derivation of the electrical parameters by the IED 514. The operating conditions may be sensed by the IED 514. Alternatively, the operating conditions may be obtained by the IED 514 from a source within the network 14 (FIG. 20).

During operation within this embodiment, the IED 514 may sense one or more of the operating conditions and selectively apply the characteristic curves during derivation of the electrical parameters. For example, where the accuracy of the measurement of electrical energy by the IED 514 and the metering sensors 516 is susceptible to changes in ambient air temperature, characteristic curves may be developed for each of a plurality of temperature ranges within the expected ambient temperature range. During operation, the IED 514 may monitor an ambient air temperature sensor (not shown) and selectively apply one of the characteristic curves based on the ambient temperature. Alternatively, the temperature may be obtained from a server (not shown) on the network 14 (FIG. 20) that includes ambient temperature data. Another example is selectively applying characteristic curves to correct errors introduced by harmonic conditions as a function of the frequency measured by the IED 514. Selective application of the characteristic curves may improve the overall accuracy of the IED 514 and reduce errors in measurement by the metering sensors 516.

In another embodiment, the IED 514 may be directed to apply some of the characteristic curves at all times while other characteristic curves may be selectively applied based on operating conditions. For example, a characteristic curve representing error correction for the position (e.g. centered, offset, etc.) of the conductors 12 within the window of a window type current sensor 532 may be continuously applied during operation. However, a characteristic curve for a particular noise or harmonic condition may be selectively applied when the IED 514 senses the presence of that operating condition.

In yet another embodiment, the characteristic curves may be determined through testing and then stored in the metering sensors 516. In this embodiment, the metering sensors 516 include a memory device (not shown) fixedly coupled to each of the metering sensors 516. The memory device may be a non-volatile memory device, such as, for example, a read only memory (ROM) or any other memory device capable of storing data representing the characteristic curves.

When the metering sensors 516 are connected with the IED 514, the IED 514 may be activated to access and extract the characteristic curves from the memory device. The characteristic curves may be transferred to the IED 514 through the electrical interface between the IED 514 and the metering sensors 516. In another embodiment, a separate data transfer line (not shown) coupling the IED 514 and each of the metering sensors 516 may be used for data communications. Following extraction, the IED 514 may store and use the characteristic curves during operation as previously discussed. Alternatively, the metering sensors 516 may provide ongoing access to the characteristic curves such that the IED 514 may selectively access and use the characteristic curves during operation.

In another embodiment, the metering sensors 516 may also contain sufficient processing capability to dynamically modify or substitute characteristic curves made available to the IED 514. Modification and substitution may be based on the operating conditions. Example operating conditions that may be monitored and used as a basis for modification and substitution include temperature, noise, tap setting, operating ranges, harmonics, window position and other similar operational parameters that may affect accuracy. In this embodiment, the characteristic curves are made available for use by the IED 514 at the direction of the metering sensors 516.

Referring once again to FIG. 15, the communication circuit 528 provides a mechanism for the transfer of characteristic curves to and from the IED 514. The communication circuit 528 may operatively cooperate with the CPU 524 to format and pass commands and information. The IED 514 may send and receive data and commands using transfer protocols, such as, for example, file transfer protocols (FTP), Simple Object Access Protocol (SOAP), Extensible Markup Language (XML) or any other protocols know in the art. In addition, the communication circuit 528 includes a communication port 540 (which may be the same as or different from communications port 24, described above) operable to provide communication signals to a network 14. The communication port 540 may be, for example, an Ethernet card, a network interface card or some other network compatible communication device capable of connection with the network 14. In addition, the communication port 540 may include wireless communication capability, such as, for example, a wireless transceiver (not shown) to access the network 14.

The network 14 may be the Internet, a public or private intranet, an extranet, or any other network configuration to enable transfer of data and commands. An example network configuration uses the Transport Control Protocol/Internet Protocol ("TCP/IP") network protocol suite, however, other Internet Protocol based networks are contemplated. Communications may also include IP tunneling protocols such as those that allow virtual private networks coupling multiple intranets or extranets together via the Internet. The network 14 may support application protocols, such as, for example, telnet, POP3, Mime, HTTP, HTTPS, PPP, TCP/IP, SMTP, proprietary protocols, or any other network protocols known in the art.

FIG. 20 illustrates a portion of one embodiment of a network distribution system 70. The network distribution system 70 includes at least one IED 514, at least one browser 72 and a plurality of servers 74 connected and operatively communicating with each other via the network 14 as illustrated. In the illustrated exemplary network distribution system 70, the network 14 includes components of a first intranet 76, an Internet 78 and a second intranet 80. Communication within network 14 may be performed with a communication medium that is included in wireline based communication systems and/or wireless based communication systems. The communication medium may be for example, a communication channel, radio waves, microwave, wire transmissions, fiber optic transmissions, or any other communication medium capable of transmitting data in wireline and wireless based communication systems.

The number and configuration of the components forming the network 14 are merely an illustrative example, and should not be construed as a limitation on the almost unlimited possibilities for configuration of the network 14. In addition, hardware within the network 14 may perform one or more of the functions described herein, as well as other well-known network functions, and therefore should not be construed as limited to the configuration described. For example the function performed by the servers 74 are illustratively described as different servers for purposes of clarity, however a single server, or more than one server may perform the functions of the servers 74. Further, the general form of the architecture is connectionless thereby allowing for substantially simultaneous communications between a substantial number of devices, such as, for example, multiple IEDs 514 and browsers 72 within the network distribution system 70. This form of scalability eclipses architectures that utilize point-to-point connections, such as, for example, those provided by telephony networks where a limited number of simultaneous communications may take place.

In the embodiment illustrated in FIG. 20, the IED 514 may communicate via the first intranet 76. As generally known in the art, intranets are comprised of software applications and various computing devices (network cards, cables, hubs, routers, etc.) that are used to interconnect various computing devices and provide a communication path. The term "intranet," as used herein, should be broadly construed to include any and all hardware and software applications that allow the IEDs 514, the browser 72, the servers 74 and other computing devices to be connected together to share and transfer data and commands. Intranets are not limited to a particular physical location and may include multiple organizations using various communication protocols. Although not illustrated, other devices, such as, for example, printers may be connected with the intranet 76, 80 to make these devices available to users of the network 14. As known in the art, various types of intranets 76, 80 exist and may be used with the presently preferred embodiments.

The browser 72 may be any application running on a computer that is capable of communicating over the network 14. The browser 72 may be an Internet browser, proprietary software or any other application capable of forming a connection with the servers 74 to send and receive information. In addition, the browser 72 may be capable of sending data to, and receiving data from, the IED 514. The browser 72 may include an intranet, a server or any other devices and applications discussed herein to interface with and communicate via the Internet 78.

The servers 74 are the primary interface to clients, such as, for example, the IED 514 and the browser 72, for all interactions with the applications or services available within the network distribution system 70. The servers 74 may operate to authenticate the clients, establish a secure connection from the clients to the servers 74, and allow applications the clients are using to transparently access other resources of the network distribution system 70. In another embodiment, the IED 514 may perform some or all of the functions of the servers. In yet another embodiment, the IED 514 may act as the servers 74. In the exemplary embodiment, the servers 74 include at least one email server 82, a plurality of firewall/gateway servers 84 and at least one master server 86. The master server 86 further comprises a server machine 90 and a database 92 in operable communication with each other. In other embodiments, additional servers, fewer servers or an individual server may be used to fulfill these functions.

The email server 82 may be any computer that includes associated communications hardware and an application capable of handling incoming and outgoing mail for the first intranet 76. An example embodiment is a computer that operates with Simple Mail Transfer Protocol (SMTP) and Post Office Protocol 3 (POP3) using applications, such as, for example, MICROSOFT WINDOWS NT and MICROSOFT EXCHANGE SERVER. The email server 82 communicates over the network 14 using the first intranet 76.

The firewall/gateway servers 84 may provide a network interfacing function, an application launching function and a firewall function. In the network interfacing function, the firewall/gateway servers 84 may be responsible for controlling traffic on the intranet 80, 76 and the interface with the Internet 78. In addition, the firewall/gateway servers 84 may include applications that can be launched by users of the intranet 76, 80 and the Internet 78. An example traffic controlling function is accepting incoming HTTP (Hypertext Transfer Protocol) messages and fulfilling the requests embedded therein. Another example would be receiving dynamic HTML (Hypertext Markup Language) page generation requests and launching the appropriate applications to fulfill those requests. Other transfer protocols, such as file transfer protocols (FTP), Simple Object Access Protocol (SOAP), Extensible Markup Language (XML) or other protocols known in the art may also be controlled by the firewall/gateway servers 84.

In the application launching function, the firewall/gateway servers 84 may include applications to manage the logical flow of data and commands and keep track of the state of sessions. A session is a period of time in which the IED 514 or the browser 72 is interacting with, and using the network distribution system 70. Other applications operating within the firewall/gateway servers 84 may include encryption and decryption software. Exemplary encryption and decryption software encrypts commands transmitted across the network 14, and decrypts data received from the network distribution system 70. In one embodiment, encryption may be done utilizing Pretty Good Privacy (PGP). PGP uses a variation of public key system, where each user has a publicly known encryption key and a private key known only to that user. The public key system and infrastructure enables users of unsecured networks, such as the Internet 78, to securely and privately exchange data through the use of public and private cryptographic key pairs.

Authentication applications may also be included in the firewall/gateway servers 84. Authentication applications may be performed for commands or data sent or received over the network 14. Authentication is the process of determining and verifying whether the device transmitting data or commands is the device it declares itself to be. In addition, authentication prevents fraudulent substitution of devices or spoofing of device data generation in an attempt to defraud. Parameters such as time/date stamps, digital certificates, physical locating algorithms such as cellular triangulation, serial or tracking ID's, which could include geographic location such as longitude and latitude may be parameters included in authentication. Authentication may also minimize data collection and control errors within the network distribution system 70 by verifying that data is being generated and that the appropriate devices are receiving commands.

The firewall function performs network security by isolating internal systems from unwanted intruders. In the example embodiment, the firewall/gateway server 84 for the first intranet 76 may isolate the IED 514, the email server 82 and the firewall/gateway server 84 from all Internet traffic that is not relevant to the operation of the network distribution system 70. In this example, the only requests allowed through the firewall may be for services pertaining to the IED 514, the email server 82 and the firewall/gateway server 84. All requests not validated and pertaining to the IED 514, the email server 82 and the firewall/gateway server 84 that are received from the Internet 78 may be blocked by the firewall/gateway server 84.

As used herein, the term Internet 78 should be broadly construed to include any software application and hardware device that is used to connect the IED 514, the browser 72 and the servers 74 with an Internet service provider (not illustrated). The Internet service provider may establish the connection to the Internet 78. The IED 514, the browser 72 and the servers 74 may establish a connection to the Internet 78 with the Internet service provider using, for example, modems, cable modems, ISDN connections and devices, DSL connections and devices, fiber optic connections and devices, satellite connections and devices, wireless connections and devices, Bluetooth connections and devices, two-way pagers or any other communication interface device(s). For the purpose of the presently preferred embodiments, it is important to understand that the IED 514, the browser 72 and the servers 74 may operatively communicate with one another through the Internet 78.

The server machine 90 and database 92 of the master server 86 may be any computer running applications that store, maintain and allow interface to the database 92. Applications, such as, for example, a database management system (DBMS) or other similar application may organize and coordinate the storage and retrieval of data from the database 92. The database 92 may be stored in a storage device, such as, for example, at least one hard drive, an optical storage media, or any other data storage device allowing read/write access to the data. The data in the database 92 may be communicated throughout the network distribution system 70 using the network 14. The data within the master server 86 may be centralized on one master server 86 or may be distributed among multiple master servers 86 that are distributed within the network distribution system 70.

In one embodiment of the master server 86, the database 92 includes data for a plurality of metering sensors 516. In this embodiment, characteristic curves for each of the metering sensors 516 are stored in the database 92 in one or more datafiles. The identifier associated with each of the metering sensors 516 provides a common identifier for the corresponding characteristic curves. In another embodiment, characteristic curves for a plurality of predetermined groups of the metering sensors 516 may be stored in the database 92 and identified with an identifier.

The database 92 may be accessed by the IED 514 and the browser 72 via the network 14. Access to the database 92 may allow the characteristic curves stored in the database 92 to be transferred to a particular IED 514. The characteristic curves may be selected from the database 92 based on the identifier associated with a particular one of the metering sensors 516 connected with the IED 514. In another embodiment, the selection may be based on identification of the predetermined group to which a particular one of the metering sensors 516 belongs. Initiation of the transfer may be accomplished by a request from the IED 514. Alternatively, the browser 72 or the master server 86 may initiate the transfer. Prior to accessing the database 92, the master server 86 may perform verification. Verification ensures that requestor has the authority to make such a request. The verification could be in the form of a password, entry of the identifier associated with a particular one of the metering sensors 516 or any other technique for verifying authorization.

In one embodiment, the use of email is the mechanism for transferring the characteristic curves to the IED 514. In this embodiment, the characteristic curves are requested by the IED 514 or the browser 72 via an email message. Alternatively, the request may be accomplished by accessing the master server 86 directly with the IED 514 or the browser 72 via the network 14. The request may identify the email address of the particular IED 514 and the desired corresponding characteristic curves. The master server 86 of this embodiment is capable of sending an email to the identified IED 514 that includes the characteristic curves. Since the master server 86 is transferring the characteristic curves via email, the firewall/gateway server 84 for the IED 514 requires no additional configuration to allow the message to be delivered to the IED 514.

Upon receipt of the email message, the email server 82 may forward the message to the identified IED 514. The IED 514 may extract the characteristic curves from the email message directly. The IED 514 may then format and store the characteristic curves for use during operation. Alternatively, the email may include an executable that the IED 514 executes to extract and store the characteristic curves. In another embodiment, the email server 82 is the designated recipient of the characteristic curves. In this embodiment, the email server 82 is a translation device. The translation device includes an application that may extract the characteristic curves from the email message and download the characteristic curves to the IED 514 via the intranet 76. In addition, the translation device may format the characteristic curves prior to download.

In another embodiment, the characteristic curves may be supplied in a data file from the master server 86. In this embodiment, the firewall/gateway server 84 may be configured to allow the data file to pass through to the intranet 76. As in the previously discussed embodiments, the IED 514, the browser 72 or the master server 86 may request the characteristic curves. In one embodiment, the master server 86 may transfer a data file containing the requested characteristic curves to a designated recipient, such as, for example, the browser 72, the firewall/gateway server 84 or some other translation device in communication with the master server 86. In this embodiment, the translation device is an IED 514 compatible device containing an application that functions to communicate with, and download the characteristic curves to the IED 514 via the network 14. In another embodiment, the IED 514 may include capability to obtain or be assigned an IP address. In this embodiment, the master server 86 may transfer the data file directly to the IED 514. Upon receipt, the IED 514 may translate the data file to a compatible format, store and begin using the characteristic curves during operation.

In yet another embodiment, the IED 514 may have capability to communicate with a translation device that is an IED compatible device such as, for example, the browser 72, the email server 82, the firewall gateway server 84 or some other device connected to the network 14. In this embodiment, the request for characteristic curves is made by the IED to the translation device. The translation device in turn communicates with the master server 86 to make the request. The master server 86 transfers the requested characteristic curves to the translation device, which, in turn transfers the characteristic curves to the IED 514.

FIG. 6 illustrates a portion of another embodiment of the network distribution system 70. The network distribution system 70 includes the email server 82, the firewall/gateway server 84, a master IED 100, a first IED 102 and a second IED 104 that operatively communicate over the Internet 78 and an intranet 106 as illustrated. In this embodiment, the master, first and second IEDs 100, 102, 104 may be physically located at the same location or may be dispersed among multiple locations.

The master IED 100 may be configured to communicate by email and/or data file transfer in the manner described by the previous embodiments. In addition, the master IED 100 may communicate with the first and second IED 102, 104 via the intranet 106. During operation, characteristic curves transferred to the master IED 100 include information identifying the final destination. The master IED 100 may use the information to route the characteristic curves to itself, the first IED 102 or the second IED 104. In addition, the master IED 100 may operate as a translation device to translate the characteristic curves into a compatible format or otherwise "unpack" and reconfigure the information received. In this embodiment, the IEDs 100, 102, 104 may also communicate using peer-to-peer communications. As such, one of the IEDs 100, 102, 104 may contain characteristic curves that may be transferred to another one of the IEDs 100, 102, 104.

Figure 21:
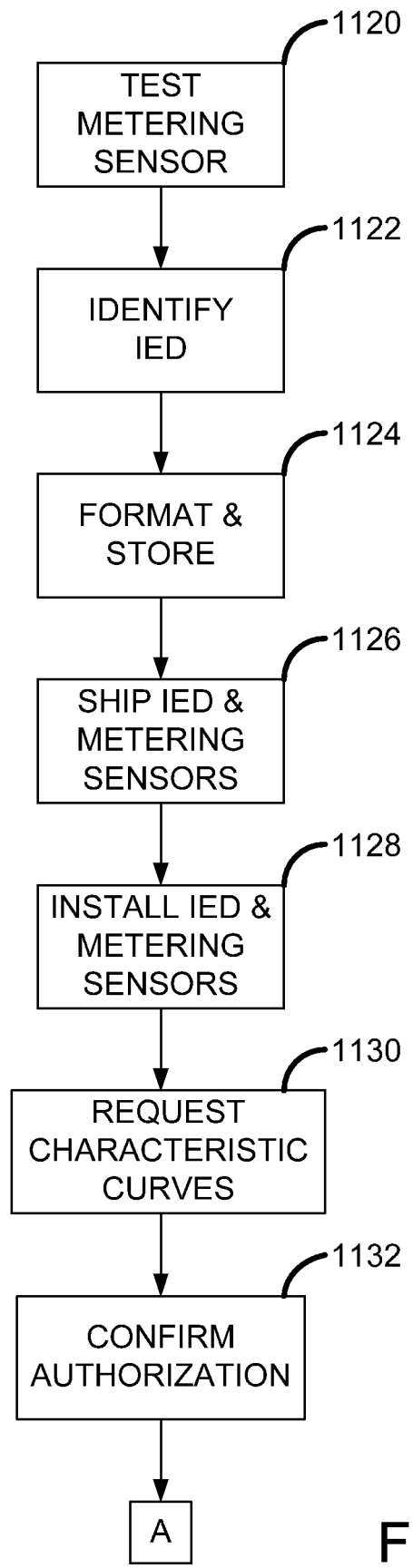
FIG. 21 is a first part of a flow diagram depicting operation of the network distribution systems illustrated in FIGS. 20 and 6.

FIG. 21 is a flow diagram illustrating operation of one embodiment of the network distribution system 70. The operation will be described with reference to the devices identified in FIGS. 20 and 6. Operation begins with testing one or more of the metering sensors 516 to determine characteristic curves at block 1120. At block 1122, the format for the characteristic curves is determined and the identifier for each of the metering sensors 516 is established. Alternatively, the identifier for the predetermined group of metering sensors 516 is established. At block 1124, the characteristic curves are formatted and stored in the master server 86 according to the previously determined identifier.

The IED 514 and the previously tested metering sensors 516 are shipped to a customer at block 1126. At block 1128, the IED 514 and the metering sensors 516 are connected, and the IED 514 is connected with the network 14. At block 1130, a request is made by the IED 514, the browser 72 or the master server 86 for at least one particular characteristic curve. The master server 86 reviews the request and verifies authorization at block 1132.

Figure 22:
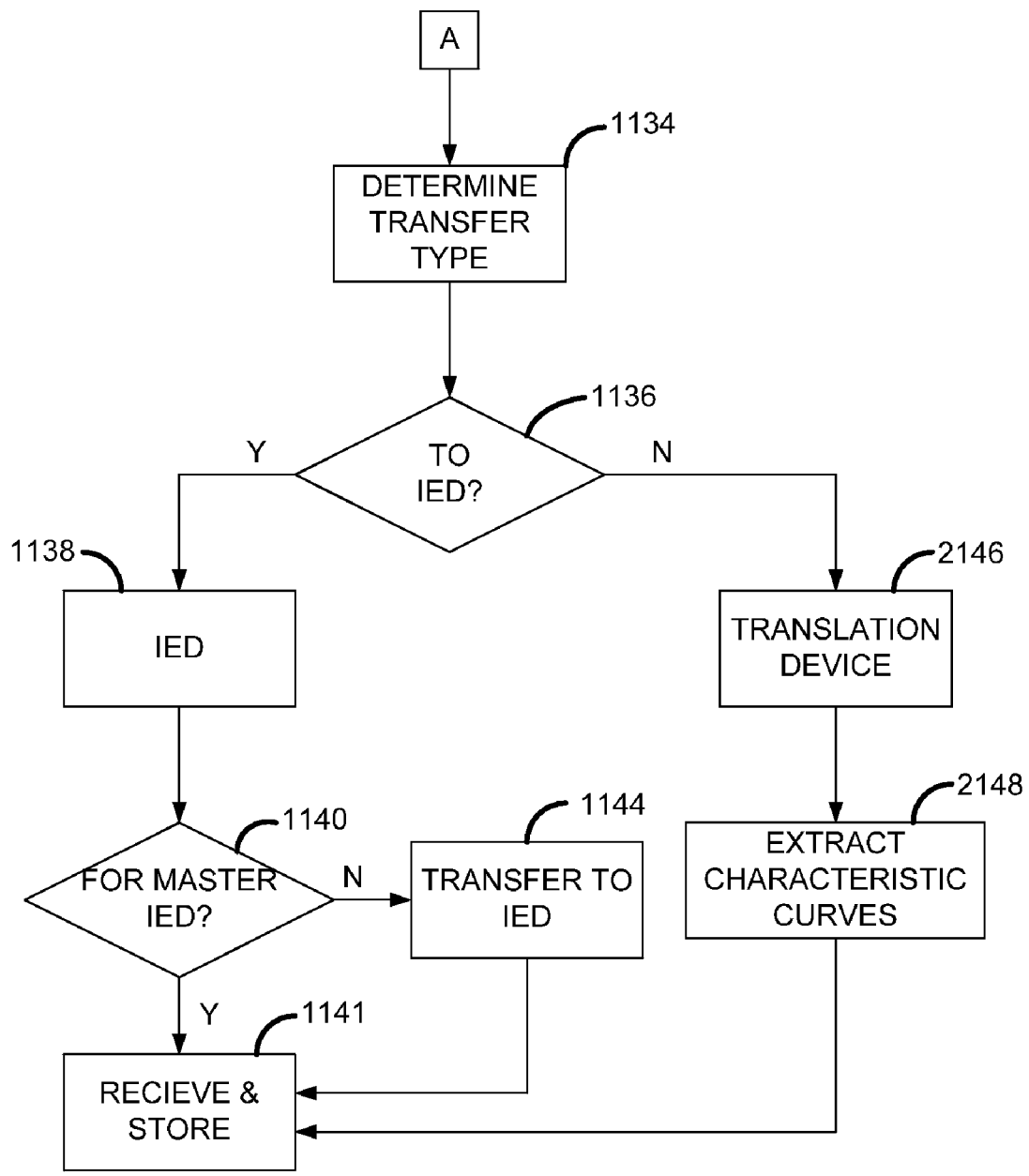
FIG. 22 is a second part of the flow diagram of FIG. 21.

Referring now to FIG. 22, following successful authorization, the master server 86 determines whether the characteristic curves should be transferred via email or via a data file at block 1134. At block 1136, the master server 86 determines if the IED 514 will receive the characteristic curves directly. If yes, the data file or email is transferred to the IED 514 at block 1138. At block 1140, where the IED 514 is a master IED 100, the master IED 100 determines if the characteristic curves are for another IED 102, 104. If the characteristic curves are for the master IED 100, the characteristic curves are received and stored for use during operation at block 1142. If the characteristic curves are for another IED 102, 104, then the master IED 100 transfers the characteristic curves to the designated IED 102, 104 at block 1144. At block 1142, the IED 102, 104 receives and stores the characteristic curves.

If the characteristic curves are not transferred directly to the IED 514 at block 1136, the data file or email is transferred to the transfer device which is the designated recipient of the characteristic curves at block 2146. At block 2148, the transfer device extracts, formats and transfers the characterized curves to the IED 514. The IED 514 receives and stores the characteristic curves for use during operation at block 1142.

Figure 23:
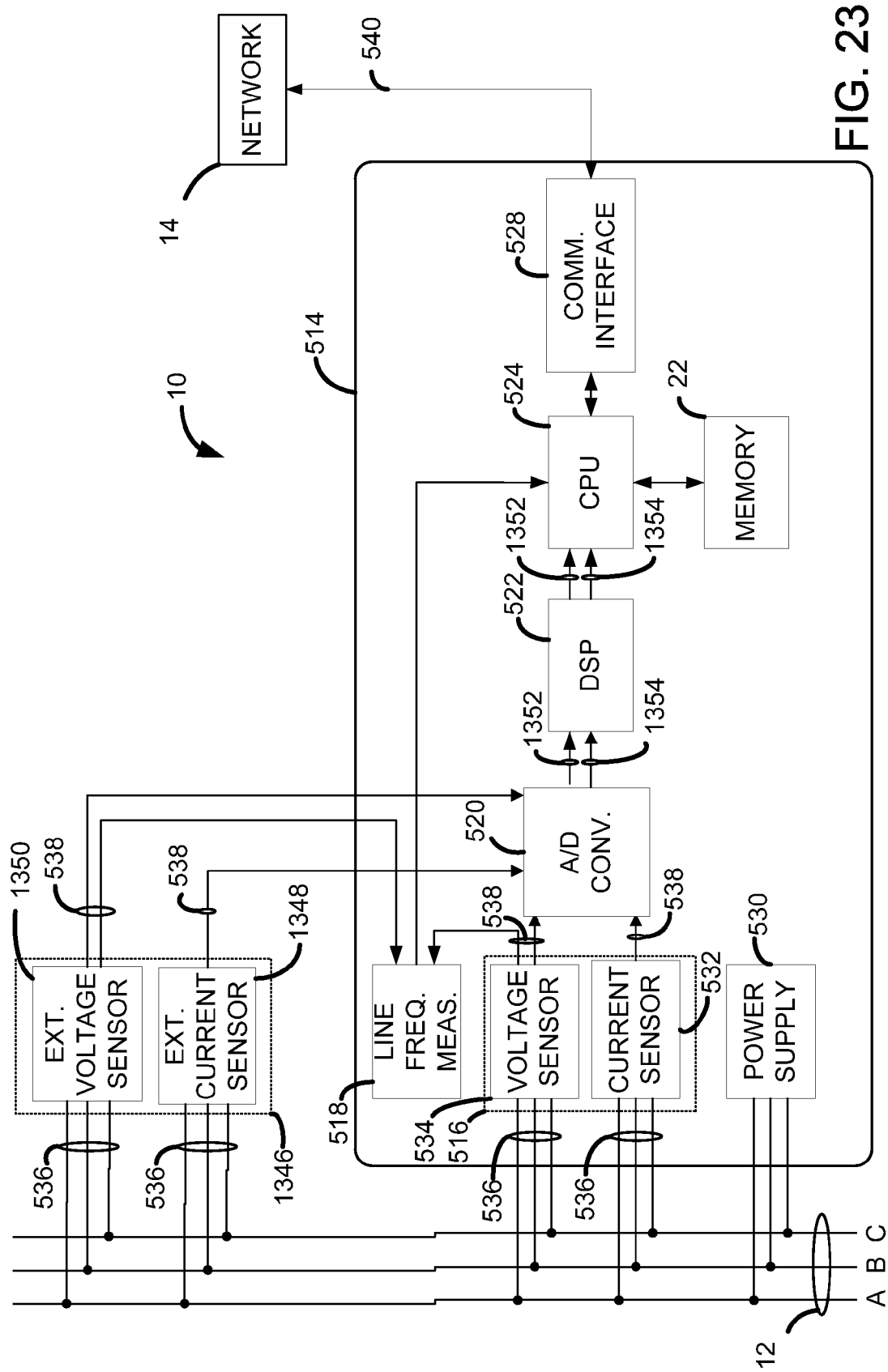
FIG. 23 is a block diagram of a portion of a power distribution system that includes another embodiment of an intelligent electronic device.

FIG. 23 illustrates another embodiment of a portion of a power distribution system 10 that includes an embodiment of the IED 514. The same element identification numbers are included in FIG. 23 as in previously discussed FIG. 15 to illustrate that the IED 514 of this embodiment includes operability and components similar to the previously discussed embodiments. For purposes of brevity, a discussion of the various components and operational aspects of the IED 514 that were previously described will not be repeated.

The IED 514 of this embodiment includes a first set of metering sensors that are external metering sensors 1346 and a second set of metering sensors that are the previously discussed metering sensors 516. The external metering sensors 1346 may be connected with the conductors 12 and the IED 514 as illustrated. The external metering sensors 1346 include an external current sensor 1348 and an external voltage sensor 1350 that may be similar to the previously discussed current sensor 532 and voltage sensor 534, respectively. In one embodiment, the external metering sensors 1346 may be clamp on sensors. Clamp on sensors may provide simple and quick installation without requiring deenergization of the conductors 12.

Both the metering sensors 516 and the external metering sensors 1346 may be used by the IED 514 to derive, store and display various electrical parameters indicative of the electrical energy present in the conductors 12. The IED 514 may switch between operation with the metering sensors 516 and the external metering sensors 1346. Switching between the use of the metering sensors 516 and the external metering sensors 1346 may be performed at the direction of a user of the IED 514. Alternatively, the IED 514 may selectively use the metering sensors 516 and the external metering sensors 1346 as a function of operating conditions. For example, where the IED 514 senses noise while monitoring with the metering sensors 516, the IED 514 may switch to the external metering sensors 1346 in an effort to minimize the noise. In another embodiment, the IED 514 may selectively use a combination of the metering sensors 516 and the external metering sensors 1346 to monitor electrical energy.

Similar to the previous embodiments, the external metering sensors 1346 may be tested to develop at least one first characteristic curve. In addition, the first characteristic curve may be obtained by the IED 514 and applied during operation with the external metering sensors 1346 to improve accuracy. Further, a predetermined group of external metering sensors 1346 may be used to develop the first characteristic curve.

In this embodiment, the A/D converter circuit 520 may generate separate digital signals representative of the output from the metering sensors 516 and the output of the external metering sensors 1346. The separate digital signals are generated by the A/D converter 520 on a first channel line 1352 and a second channel line 1354 for transfer to the DSP circuit 522. The DSP circuit 522 may perform signal enhancement and provide the enhanced digital signals to the CPU 524 on the first and second channel lines 1352, 1354.

The CPU 524 may select either the metering sensors 516, the external metering sensors 1346 or a combination of both as previously discussed. In one embodiment, the CPU 524 may use the external metering sensors 1346 and the first characteristic curve to perform monitoring of electrical energy. In this embodiment, the external metering sensors 1346 may be clamp on type sensors thereby allowing installation and activation of the IED 514 without deenergizing the conductors 12. Accurate monitoring of electrical energy by the IED 514 using the external metering sensors 1346 may therefore be advantageously performed on a temporary basis without the need for permanent electrical installation.

In another embodiment, the CPU 524 may use the external metering sensors 1346 to perform calibration of the metering sensors 516. In this embodiment, the IED 514 operates with improved accuracy as a function of the first characteristic curve. During operation, when a calibration function is initiated, the IED 514 uses the outputs from both the external metering sensors 1346 and the metering sensors 516 to derive two sets of the same electrical parameters. The IED 514 may compare the electrical parameters derived from the metering sensors 516 with same electrical parameters derived from the external metering sensors 1346 and the first characteristic curve. As a function of this comparison, at least one second characteristic curve may be generated for the metering sensors 516. The second characteristic curve for the metering sensors 516 may be stored in the IED 514. Alternatively, the second characteristic curve may be stored in the metering sensors 516 or elsewhere in the network 14 as previously discussed.

In one embodiment, the IED 514 is performing calibration of metering sensors while connected with the network 14. As in the previously discussed embodiments, the IED 514 may communicate with servers and other devices in the network 14. In this embodiment, the second characteristic curve may be transferred over the network 14 to the master server 86 (FIG. 20) the browser 72 (FIG. 20) or some other data storage device following generation. As in the previously discussed embodiments, the transfer of the second characteristic curve may be by email or by a data file. Initiation of the transfer may be similar to the previously discussed embodiments.

Figure 24:
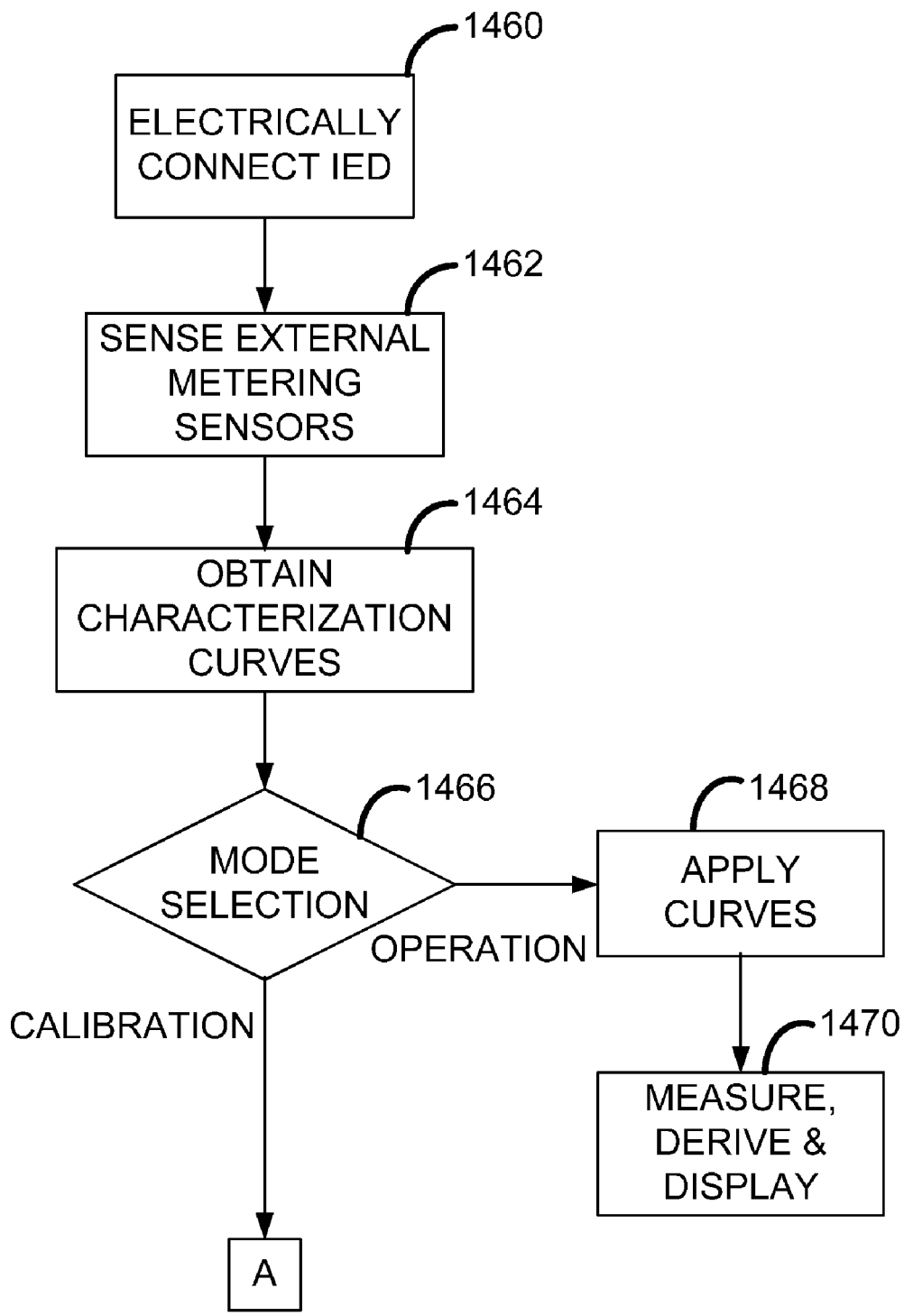
FIG. 24 is a first part of a flow diagram depicting operation of the intelligent electronic device illustrated in FIG. 23.

FIG. 24 is a flow diagram illustrating operation of another embodiment of the IED 514. The operation begins at block 1460 where the IED 514 is connected with the conductors 12 and the external metering sensors 1346 as illustrated in FIG. 23. At block 1462, the IED 514 is energized and the connection with the external metering sensors 1346 is sensed. At least one first characteristic curve corresponding to the metering sensors 1346 is located and obtained at block 1464. As previously discussed, the first characteristic curve may be stored in the IED 514, the external metering sensors 1346 or elsewhere in the network 14. At block 1466, the IED 514 may be placed in a monitoring mode or in a calibration mode. If the IED 514 is placed in the monitoring mode, the first characteristic curve may be selectively applied during derivation of the electrical parameters with the external metering sensors 1346 at block 1468. At block 1470, high accuracy measurement, derivation and display of various electrical parameters is performed.

Figure 25:
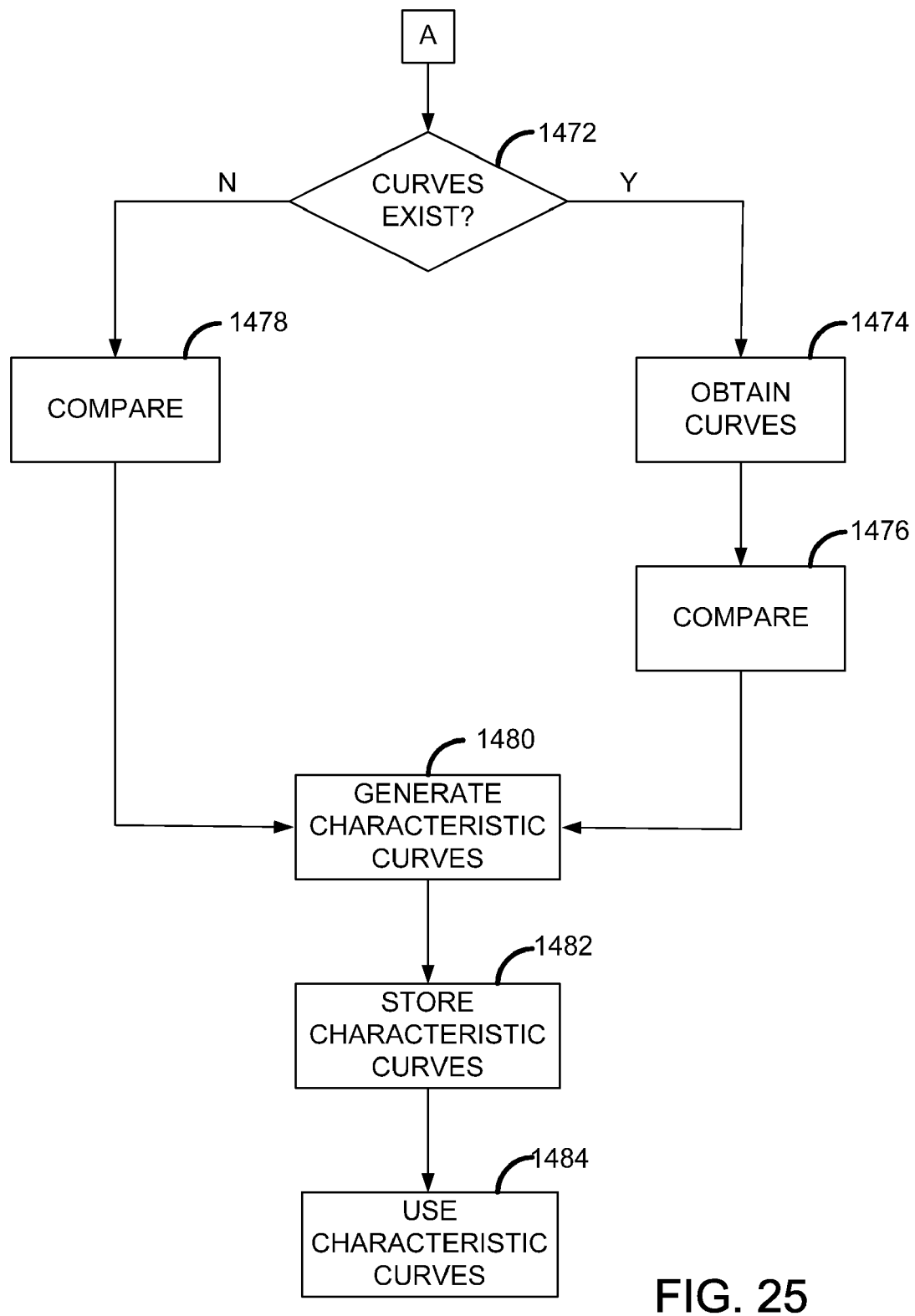
FIG. 25 is a second part of the flow diagram of FIG. 24.

Referring now to FIG. 25, if the IED 514 is placed in the calibration mode at block 1466, determination of whether at least one second characterization curve exists for the metering sensors 516 is performed at block 1472. If the second characteristic curve exists, it is obtained at block 1474. At block 1476, the electrical parameters derived with the external metering sensors 1346 and the first characteristic curve are compared with the same electrical parameters derived with the metering sensors 516 and the second characteristic curve.

If, at block 1472, characterization curves do not exist for the metering sensors 516, the electrical parameters derived with the external metering sensors 1346 and the first characteristic curve are compared at block 1478 with the same electrical parameters derived with the metering sensors 516. At least one second characteristic curve for the metering sensors 516 may be generated for any differences in the electrical parameters identified to be outside of predetermined thresholds at block 1480. At block 1482, the second characteristic curve for the metering sensors 516 is stored. Storage of the second characteristic curve may be in the IED memory 22, the first metering sensors 516 or elsewhere in the network 14. The IED 514 may use the second characteristic curve during operation, as in the previously discussed embodiments, at block 1484.

The embodiments of the IED 514 may provide improved accuracy for measurement, display and reporting of energy parameters. Accuracy improvement is achieved by generating characteristic curves for a particular one of the metering sensors 516, 1346 or predetermined groups of the metering sensors 516, 1346 through testing. The characteristic curves may be determined prior to installation of the metering sensors 516, 1346; or the IED 514 may perform self-testing to develop the characteristic curves. The characteristic curves may be stored in the IED 514, or the metering sensors 516, 1346, and selectively used during operation to minimize inaccuracy. Alternatively, the characteristic curves may be transferred to the IED 514 using the network 14. The resulting dynamic calibration of the IED 514 provides improved accuracy in measured and calculated electrical parameters representative of the electrical energy present in the conductors 12 during varying operating conditions.

While the invention has been described above by reference to various embodiments, it will be understood that many changes and modifications can be made without departing from the scope of the invention. It is therefore intended that the foregoing detailed description be understood as an illustration of the presently preferred embodiments of the invention, and not as a definition of the invention. It is only the following claims, including all equivalents, which are intended to define the scope of this invention.

We claim:

1. An electric power meter having an analog to digital converter coupled with a sensor operative to sense electrical energy in one or more conductors and output corresponding electrical signals, the analog to digital converter being operative to convert the electrical signals output by the sensor to corresponding digital signals and having a processor for processing at least one of the digital signals, comprising:
   a memory for storing network application protocol conversion algorithms; and
   a network interface operative to implement a network communication protocol;
   wherein said processor performs at least one power calculation and converts at least one of the digital signals and the power calculation to at least one network application protocol different from said network communication protocol using one of said network application protocol conversion algorithms, said at least one network application protocol provided through said network interface;
   wherein said network application protocol is one of e-mail, File Transfer Protocol (FTP), or Hypertext Transfer Protocol (HTTP).

2. The electric power meter of claim 1, wherein a web server provides data to the network interface in Hypertext Markup Language (HTML) or Extensible Markup Language (XML) format.

3. The electric power meter of claim 1, further comprising: an external device interface for connecting an external device to said electric power meter, wherein said external device transmits digital signals to said electric power meter to be processed and provided to said user through said network interface.

4. The electric power meter of claim 1, wherein said network interface supports multiple users simultaneously.

5. The electric power meter of claim 1, wherein said network interface is an Ethernet interface.

6. An electric power meter having an analog to digital converter coupled with a sensor operative to sense electrical energy in one or more conductors and output corresponding electrical signals, the analog to digital converter being operative to convert the electrical signals output by the sensor to corresponding digital signals and having a processor for processing at least one of the digital signals, comprising:
   a memory for storing network application protocol conversion algorithms; and
   a network interface operative to implement a network communication protocol;
   wherein said processor performs at least one power calculation and converts at least one of the digital signals and the power calculation to at least one network application protocol different from said network communication protocol using one of said network application protocol conversion algorithms, said at least one network application protocol provided through said network interface;
   wherein a web server provides data to the network interface in Hypertext Markup Language (HTML) or Extensible Markup Language (XML) format.

7. The electric power meter of claim 6, further comprising:
   an external device interface for connecting an external device to said electric power meter, wherein said external device transmits digital signals to said electric power meter to be processed and provided to said user through said network interface.

8. The electric power meter of claim 6, wherein said network interface supports multiple users simultaneously.

9. The electric power meter of claim 6, wherein said network interface is an Ethernet interface.

10. A system for modifying the functionality of the electric power meter of claim 4 previously installed in the field and operating, the system comprising:
    a server computer, the electric power meter in communication with the server computer over a network, the electric power meter operated with a software configuration stored therein; and
    a storage device in communication with the server computer, the storage device comprising a database, wherein a copy of the software configuration is stored in the database, the server is operable to modify the operation of the electric power meter as a function of modifications to the database.

11. The system of claim 10 wherein the server computer comprises a network server operatively communicating with a master server, the network server operable to generate display pages to create a virtual meter site and the master server operable to maintain the database.

12. The system of claim 10, wherein the server computer comprises an intelligent electronic device operatively communicating over the network.

13. The system of claim 10, further comprising a browser coupled to the server computer, the browser operable to access the database.

14. The system of claim 10, wherein the software configuration comprises firmware and frameworks.

15. The system of claim 14, wherein the server is operable to perform modifications to the firmware and frameworks as a function of selections lists selectable by a user.

16. The system of claim 15, wherein said electric power meter is operative to contact a second server to authorize payment for said modifications.

17. The system of claim 10, wherein the network comprises an Intranet.

18. The system of claim 10, wherein the network comprises an Internet Protocol based network.

19. The system of claim 10, wherein the electric power meter comprises a watt-hour meter.

20. The system of claim 10, wherein the software configuration is stored in said memory and said memory comprises volatile memory and non-volatile memory, wherein a first portion of the software configuration is stored in the non-volatile memory and a second portion of the software configuration is stored in the volatile memory.

21. The system of claim 20, wherein the second portion of the software configuration is transferable over the network from the database to the electric power meter as a function of instructions within the first portion of the software configuration.

22. The system of claim 20, wherein the server is operable to modify the operation of the electric power meter with an update transferable over the network to the electric power meter.

23. The system of claim 22, wherein the update comprises a modified software configuration.

24. The system of claim 22, wherein the update comprises a modification to the software configuration.

25. The system of claim 22, wherein the update comprises an enabling mechanism.

26. The system of claim 22, wherein the update comprises an email message.

27. The system of claim 22, wherein the update comprises a datafile.

28. An electric power meter having an analog to digital converter coupled with a sensor operative to sense electrical energy in one or more conductors and output corresponding electrical signals, the analog to digital converter being operative to convert the electrical signals output by the sensor to corresponding digital signals, comprising:
- a processor coupled to said analog to digital converter and configured to execute a plurality of different tasks related to said digital signals and running independently from one another in response to a plurality of concurrent requests submitted by multiple users;
- a memory coupled to said processor for storing network application protocol conversion algorithms; and
- a network interface operative to implement a network communications protocol and configured to simultaneously provide said multiple users each with a result of a respective one of said plurality of different tasks;
- wherein said processor performs at least one power calculation and converts at least one of the digital signals and the power calculation to at least one network application protocol different from said network communications protocol using one of said network application protocol conversion algorithms, said at least one network application protocol being provided through said network interface via said network communications protocol;
- wherein said network application protocol is one of e-mail, File Transfer Protocol (FTP), or Hypertext Transfer Protocol (HTTP).

29. An electric power meter having an analog to digital converter coupled with a sensor operative to sense electrical energy in one or more conductors and output corresponding electrical signals, the analog to digital converter being operative to convert the electrical signals output by the sensor to corresponding digital signals, comprising:
- a processor coupled to said analog to digital converter and configured to execute a plurality of different tasks related to said digital signals and running independently from one another in response to a plurality of concurrent requests submitted by multiple users;
- a memory coupled to said processor for storing network application protocol conversion algorithms; and
- a network interface operative to implement a network communications protocol and configured to simultaneously provide said multiple users each with a result of a respective one of said plurality of different tasks;
- wherein said processor performs at least one power calculation and converts at least one of the digital signals and the power calculation to at least one network application protocol different from said network communications protocol using one of said network application protocol conversion algorithms, said at least one network application protocol being provided through said network interface via said network communications protocol;
- wherein a web server provides data to the network interface in Hypertext Markup Language (HTML) or Extensible Markup Language (XML) format.

* * * * *